(12) United States Patent
Salmani et al.

(10) Patent No.: US 9,513,342 B1
(45) Date of Patent: *Dec. 6, 2016

(54) METHOD FOR SMALL-SIGNAL STABILITY ASSESSMENT OF POWER SYSTEMS WITHIN INSTABILITY BORDERS USING SOURCE SIDE AND LOAD SIDE PERTURBATIONS

(71) Applicant: The Florida State University Research Foundation, Inc., Tallahassee, FL (US)

(72) Inventors: Mohamadamin Salmani, Tallahassee, FL (US); Chris S. Edrington, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/131,729

(22) Filed: Apr. 18, 2016

Related U.S. Application Data

(63) Continuation of application No. 14/702,063, filed on May 1, 2015, now Pat. No. 9,316,701.

(60) Provisional application No. 61/989,234, filed on May 6, 2014.

(51) Int. Cl.
*G01R 21/00* (2006.01)
*G01R 31/40* (2014.01)
*G01R 27/16* (2006.01)

(52) U.S. Cl.
CPC ............... *G01R 31/40* (2013.01); *G01R 27/16* (2013.01)

(58) Field of Classification Search
CPC ................................ G01R 31/40; G01R 27/00
See application file for complete search history.

(56) References Cited

U.S. PATENT DOCUMENTS

| | | | |
|---|---|---|---|
| 9,316,701 B1* | 4/2016 | Salmani | G01R 31/40 |
| 2014/0032148 A1* | 1/2014 | Verhulst | G01R 27/16 702/65 |
| 2014/0122050 A1* | 5/2014 | Fu | H02J 4/00 703/18 |

OTHER PUBLICATIONS

Huang et al, Small-Signal Impedance Measurement of Power-Electronics-Based AC Power Systems Using Line-to-Line Current Injection, IEEE, vol. 24, No. 2, Feb. 2009, pp. 445-455.*
Shen, Design and Implementation of Three-phase AC Impedance Measurement Unit (IMU) with Series and Shunt Injection, IEEE, 978-1-4673-8/13, 2013, pp. 2674-2681.*

* cited by examiner

*Primary Examiner* — Sujoy Kundu
*Assistant Examiner* — Lisa Peters
(74) *Attorney, Agent, or Firm* — Molly L. Sauter; Smith & Hopen, P.A.

(57) ABSTRACT

A novel method for real-time small-signal stability analysis within the instability borders for power electronic-based components in a power system. The method may be used to monitor a power system in real-time by perturbing the source side of an electronic-based component of the power system of about 0.5 to 1 percent of a nominal current of the power system at the source side, and perturbing the load side of the power electronic-based component by varying the voltage at the load side. Time-domain results of the perturbations may be transferred to frequency-domain results and the stability of the power system may be monitored by obtaining a Nyquist contour and employing unit circuit criterion or Generalized Nyquist Criterion.

10 Claims, 23 Drawing Sheets

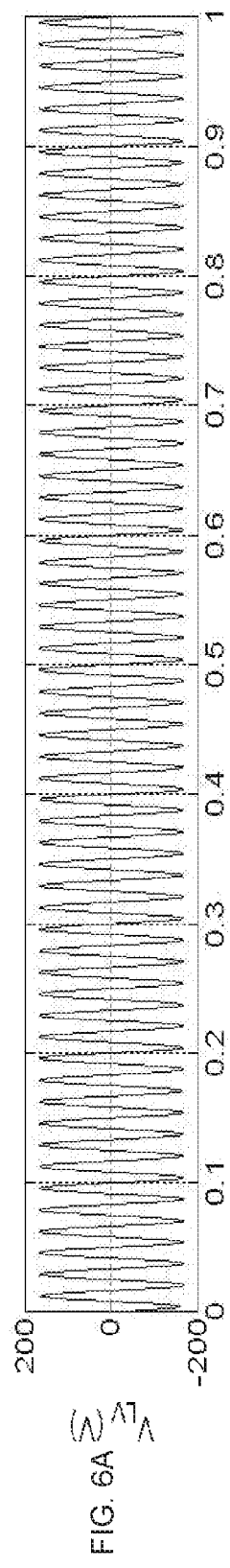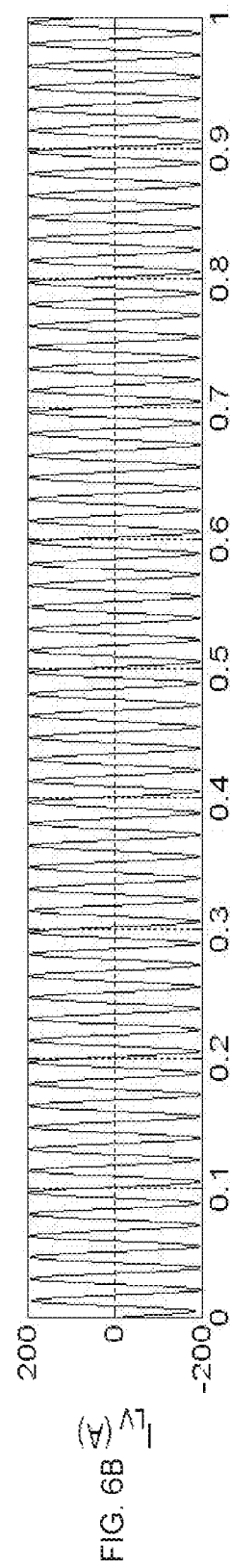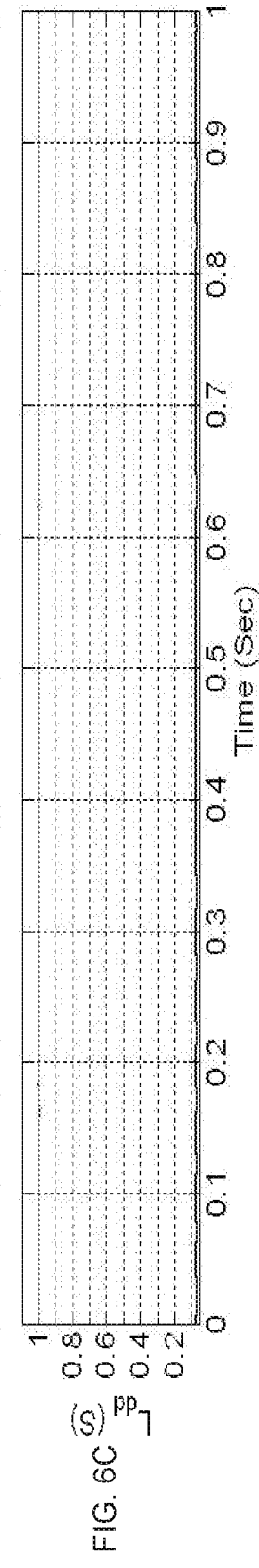

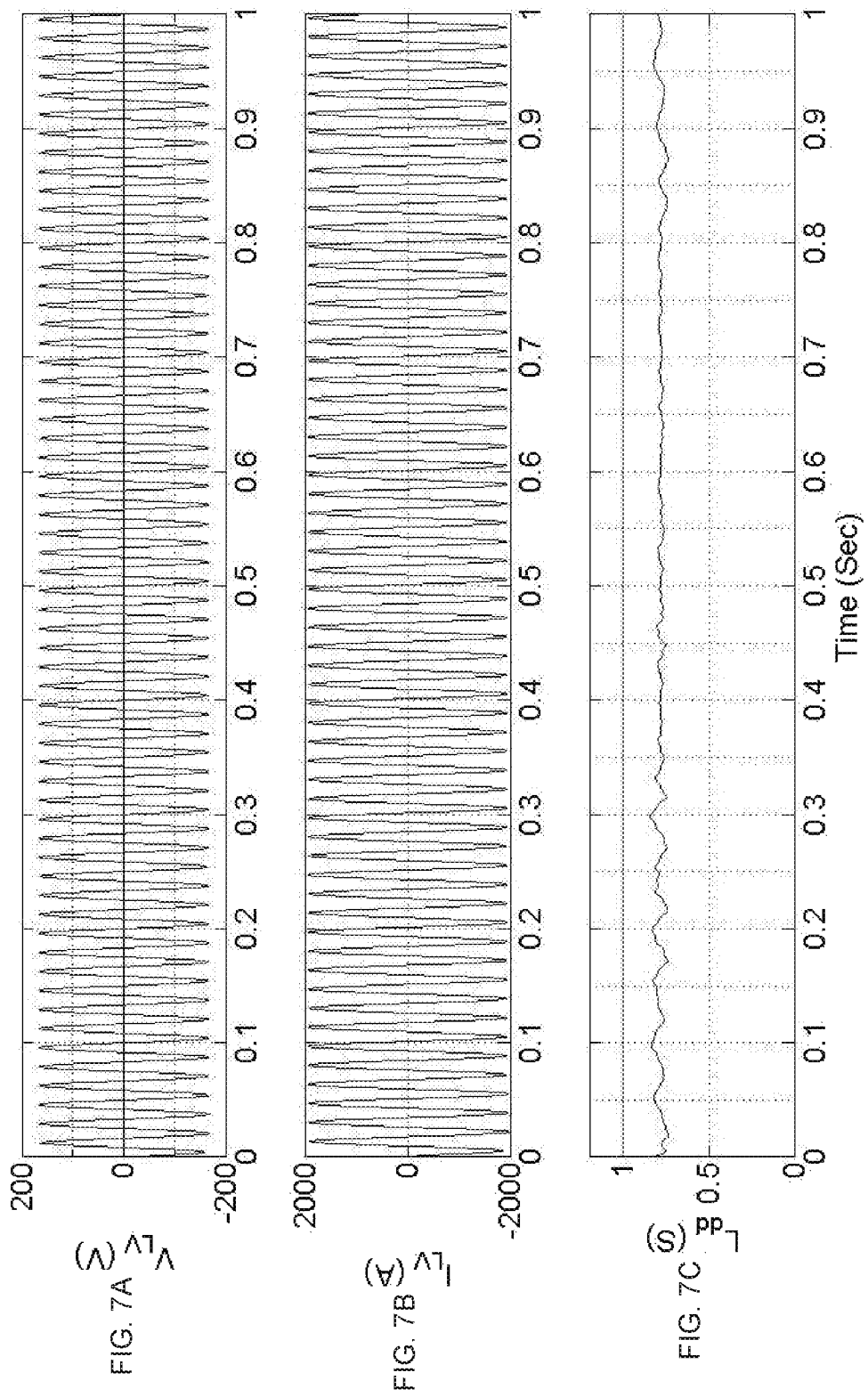

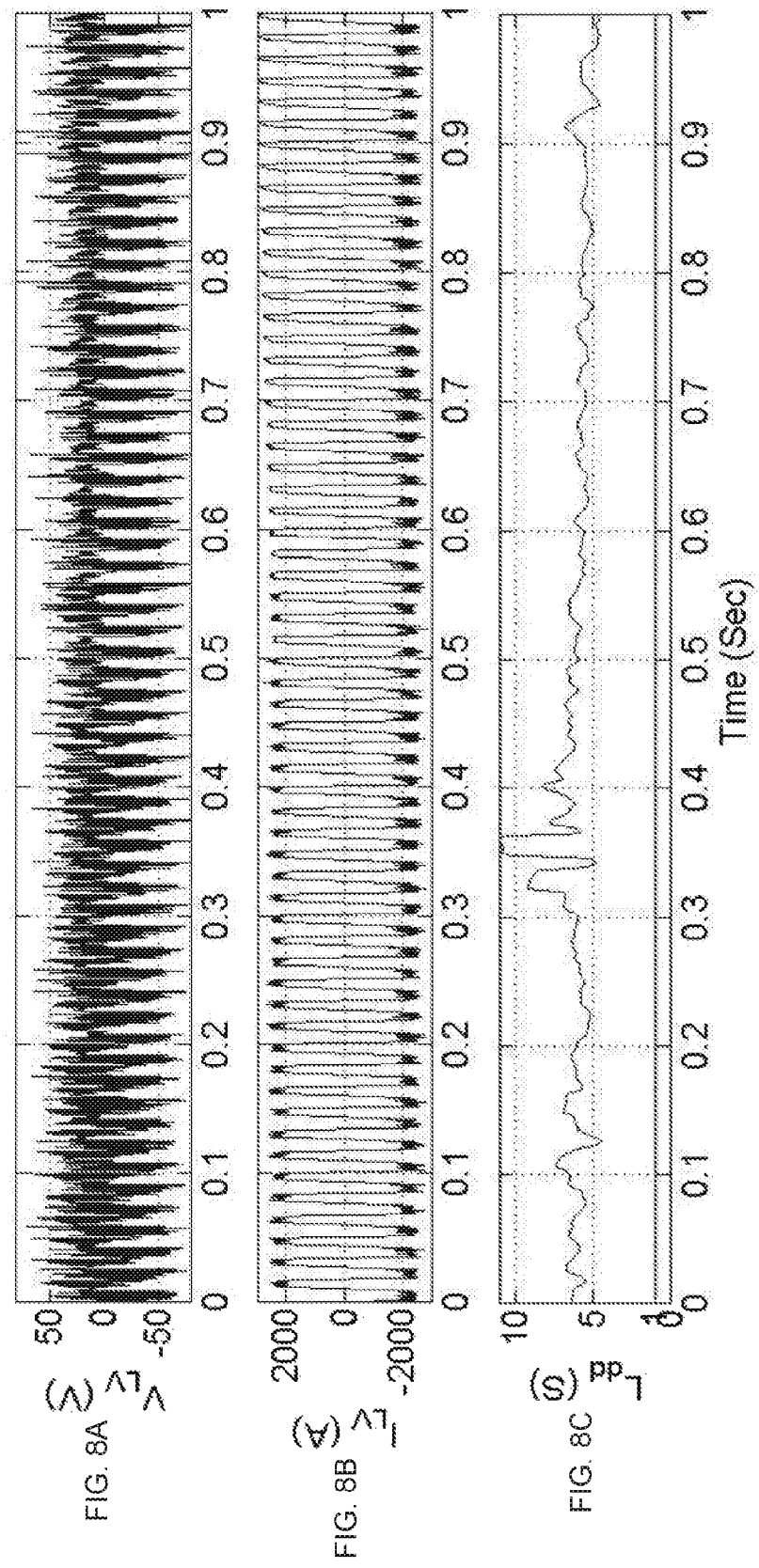

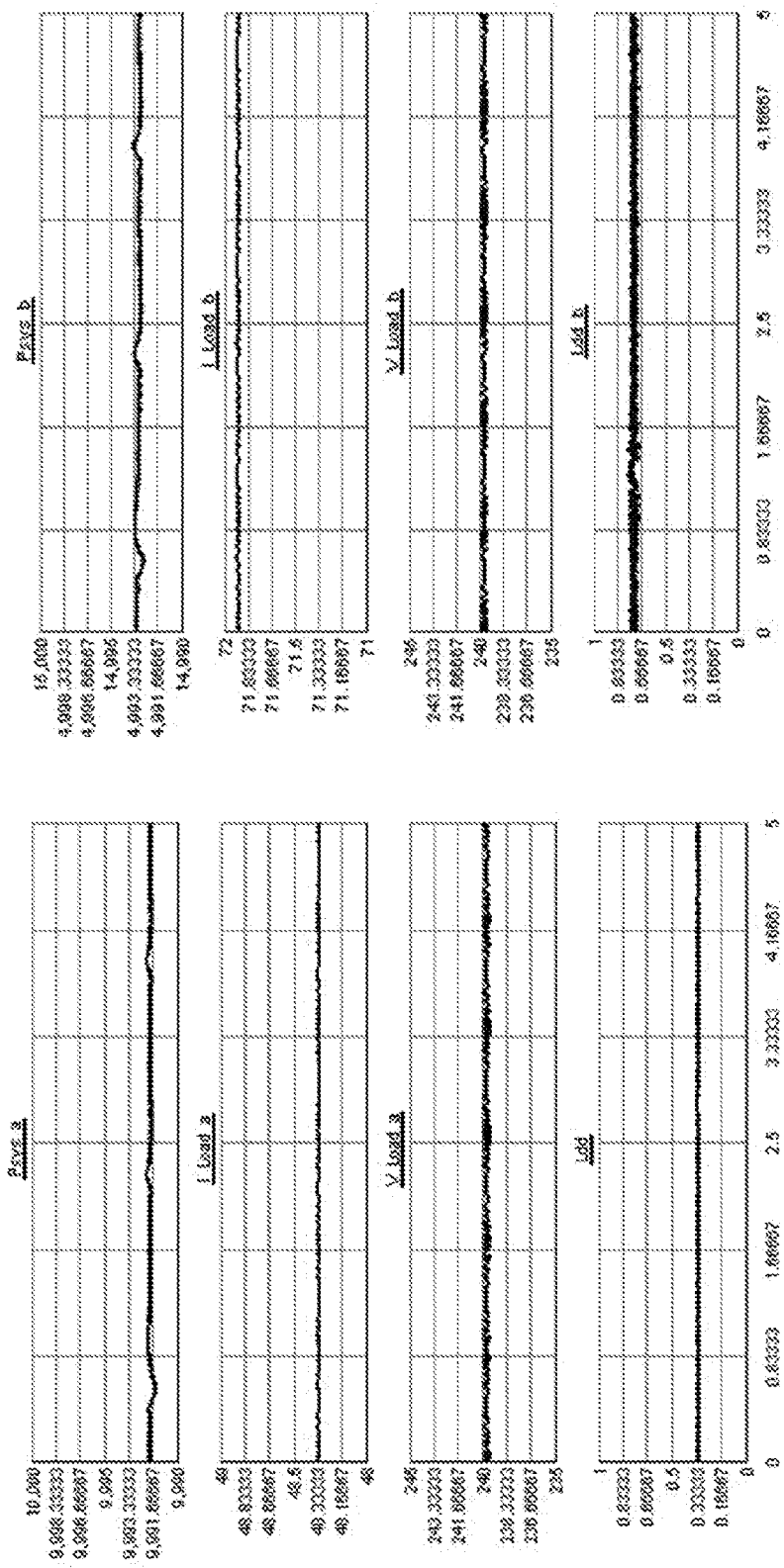

METHOD FOR SMALL-SIGNAL STABILITY ASSESSMENT OF POWER SYSTEMS WITHIN INSTABILITY BORDERS USING SOURCE SIDE AND LOAD SIDE PERTURBATIONS

CROSS-REFERENCE TO RELATED APPLICATIONS

The present application claims priority to U.S. Pat. No. 9,316,701 filed on May 1, 2015 and titled "Real-Time Small-Signal Stability Assessment of Power Electronic-Based Components in Contemporary Power Systems", which claims priority to provisional U.S. Patent Application Ser. No. 61/989,234 filed on May 6, 2014, titled, "Small-Signal Stability Assessment of Power Electronic-Based AC Systems," which are hereby incorporated by reference in their its entirety.

FEDERALLY SPONSORED RESEARCH OR DEVELOPMENT

This invention was made in part with Government support under Grant No. EEC-0812121 awarded by the ERC Program of the National Science Foundation. The government has certain rights in the invention.

BACKGROUND OF THE INVENTION

1. Field of the Invention

This invention relates, generally, to stability of power systems. More specifically, it relates to small-signal stability analysis techniques and criteria based on impedance measurements of power electronic-based components. The real-time stability analysis technique is capable to assess the small signal stability of the power systems while they are operating (in real-time) and to monitor the systems' stability status online.

2. Brief Description of the Prior Art

Utilizing power electronic-based components (PECs) in power systems is of growing importance because these devices can considerably enhance the characteristics of the power systems such as power quality, voltage regulation, and power factor. Consequently, as the world anticipates a sustainable energy future, large scale integration of variable power generation as well as PECs into the grid is on the rise. Nevertheless, PECs may have a substantial effect on the stability of power electronic-based distribution systems (PEDS), particularly in a large scale power system with high penetration of the PECs. Therefore, the nature of stability assessment of PEDS has significantly changed due to the capability of these devices to operate as negative impedances in the systems. Constant power loads (CPLs) can represent negative impedance characteristics, from the small-signal viewpoint, in systems with a natural destabilizing effect [1]. Generally, tendency of the PECs to behave as CPLs is the main reason for instability in the PEDS [2]. In the PEDS, small-signal stability should be addressed as well as all other types of traditional stabilities such as large-signal stability. Due to this fact, stability assessment of the PEDS is more sophisticated than stability study of the conventional power distribution systems.

Although, small-signal stability study of the PECs has been addressed in numerous research studies to date, considering stability in a system comprising several PECs is the goal of these types of studies. Generally, the stability of the systems in related literature is divided into three main categories: steady-state, small-signal and large-signal [3].

Steady-state analysis is the initial step to approach a system stability study that provides significant understanding of the system behavior during normal operation. In the conventional power system stability studies, stability from a steady-state viewpoint is utilized. Herein, steady-state stability analysis indicates all types of traditional stability analysis in the power systems area which itself may be categorized as steady-state, dynamic, and transient stability in the literature [4]. In the present disclosure, it is assumed that the system is stable in steady-state since it is a prerequisite condition for small-signal stability analysis. Therefore, different types of steady-state stability are not addressed. In addition, the present disclosure addresses the stability of small-signal systems around a desirable operating point. Generally, small-signal stability techniques are developed based on average linearized models around the equilibrium points which allow the use of various analytical tools such as Nyquist, Bode, and Root-locus plots that can facilitate the study. Almost all the small-signal stability assessment techniques for the PEDS have utilized Middlebrook's criterion [5] to ensure small-signal stability of the systems by preventing the Nyquist contour of $Z_{source}(s)/Z_{load}(s)$ from encircling the $(-1+j0)$ point in the s-plane. This condition also may be addressed from an eigenvalue viewpoint; encirclement by the Nyquist contour is identical to an eigenvalue on the right-hand plane (RHP).

Small-signal stability of the systems can be investigated in both design and operational modes. Therefore, several criteria and techniques were previously developed in the associated research. Among all the stability criteria proposed in the studies, impedance measurement-based techniques are one of the strongest and well-developed methods which have been utilized more than other methods and with different small-signal stability criteria.

The small-signal stability assessment based on the impedance measurement technique and Nyquist criterion in the present disclosure has a significant advantage over aforementioned techniques. The main advantage is the capability of this technique to be developed for real-time applications. Although real-time small-signal stability assessment of the PEDS is an extremely significant subject, it has not currently been addressed. By increasing penetration of PECs in a large scale power grid, steady-state and large-signal stability analysis cannot ensure the overall stability of the system. Small-signal stability of a system during operation should be investigated as well to prevent instabilities in distribution and sub-transmission levels of the power systems. In the present disclosure, several dominant concepts from previously developed stability techniques are utilized and by taking advantage of the mathematics an algorithm is modified in order to facilitate implementation.

Accordingly, what is needed is a novel method for real-time small-signal stability assessment of the PEDs using impedance measurement-based techniques. However, in view of the art considered as a whole at the time the present invention was made, it was not obvious to those of ordinary skill in the field of this invention how the shortcomings of the prior art could be overcome.

All referenced publications are incorporated herein by reference in their entirety. Furthermore, where a definition or use of a term in a reference, which is incorporated by reference herein, is inconsistent or contrary to the definition of that term provided herein, the definition of that term provided herein applies and the definition of that term in the reference does not apply.

While certain aspects of conventional technologies have been discussed to facilitate disclosure of the invention, Applicants in no way disclaim these technical aspects, and it is contemplated that the claimed invention may encompass one or more of the conventional technical aspects discussed herein.

The present invention may address one or more of the problems and deficiencies of the prior art discussed above. However, it is contemplated that the invention may prove useful in addressing other problems and deficiencies in a number of technical areas. Therefore, the claimed invention should not necessarily be construed as limited to addressing any of the particular problems or deficiencies discussed herein.

In this specification, where a document, act or item of knowledge is referred to or discussed, this reference or discussion is not an admission that the document, act or item of knowledge or any combination thereof was at the priority date, publicly available, known to the public, part of common general knowledge, or otherwise constitutes prior art under the applicable statutory provisions; or is known to be relevant to an attempt to solve any problem with which this specification is concerned.

BRIEF DESCRIPTION OF THE DRAWINGS

For a fuller understanding of the invention, reference should be made to the following detailed description, taken in connection with the accompanying drawings, in which:

FIGS. 6A through 6C are graphs depicting simulation results for the asymptotic stable SST connected to the RL load. FIGS. 6A and 6B show time-domain results for the voltage and current of the secondary side, and FIG. 6C illustrates the stability criterion.

FIGS. 7A through 7C are graphs depicting simulation results for the marginal stable test bed. FIGS. 7A and 7B show time-domain results for the voltage and current of the secondary side, and FIG. 7C illustrates the stability criterion.

FIGS. 8A through 8C are graphs depicting simulation results for the test bed in the unstable condition. FIGS. 8A and 8B show time-domain results for the totally disordered voltage and current of the LV side, and FIG. 8C illustrates the stability criterion.

FIG. 18A is a graph of simulation results in RSCAD for SST1, and FIG. 18B is a graph of the simulation results for SST2, both in their normal operation.

DETAILED DESCRIPTION OF THE INVENTION

Small-Signal Impedance Measurement-Based Techniques

Small-signal stability analysis of Power Electronic-based Distribution Systems (PEDS) plays a prominent role in different stages of the systems analyses such as preoperational (design), operational, and post-operational. Due to increases in integration of renewable energy resources into power systems, in addition to invention of Power Electronic-based Components (PECs) such as Solid State Transformers (SSTs), machine drives, and inverters, the nature of stability investigation is considerably changed due to the capability of these devices to operate as negative impedances in the systems. Therefore, small-signal stability needs to be addressed as well as large-signal stability in the PEDS. In addition, since the power consumers in the system are currently more sensitive, the priority to have a complete and comprehensive stability study of the system is desirable. The present disclosure describes small-signal stability analysis techniques developed based on impedance measurement of the PECs. Various embodiments may comprise a new small-signal stability analysis method based on d-q impedance measurement, and the stability of an individual SST connected to the AC source/load is investigated from its AC interface.

Impedance measurement-based technique is one of the main and well-developed techniques for small-signal stability analysis for the PEDS which was developed from the Perturb and Observe algorithm. This technique has been used for stability studies for both DC and AC interfaces of PECs. Considering DC and AC converters, small-signal stability analysis may be categorized into DC and AC systems, respectively. There are various choices of how to achieve stability at the DC link, ranging from passive to active techniques. Basically in a DC stability study, stability of the hybrid AC/DC system is investigated in the DC interface; whereas in an AC stability study of the same system, the small-signal stability is studied from the AC interface.

Using this technique, a range of source/load impedance (admittance) may be developed in order to maintain in a stable region for a specific PEC. Consequently, it is more appropriate to consider it as a design technique in most cases as opposed to operational/post-operational techniques. Several studies were dedicated to developing impedance measurement-based techniques to date.

Impedance Measurement at DC Interfaces

Figure 23:
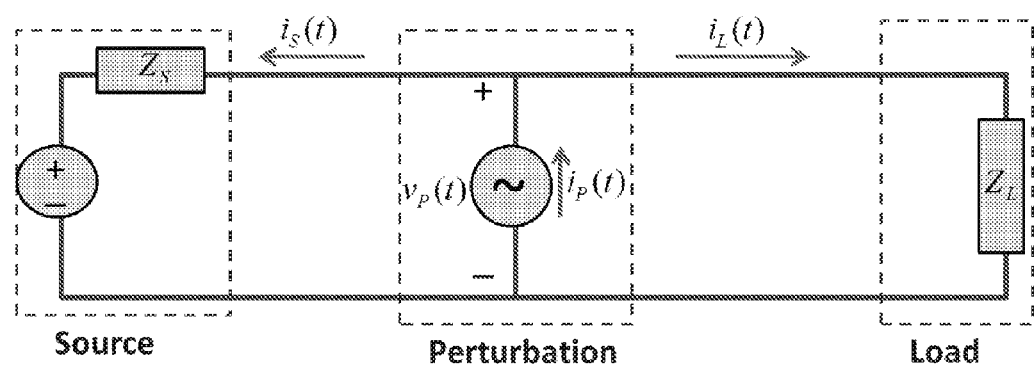
FIG. 23 is a schematic of a circuit diagram of a circuit for impedance measurement technique in a DC system.

The general idea of impedance measurement is inspired from the Perturb and Observe algorithm. Generally, the system has to be perturbed (voltage or current) and by measuring the system's response at the source-load interface, the DC source and load impedance may be calculated. The impedances can be calculated from Equation 1. FIG. 23 illustrates the DC system and source-load interface, and where the perturbation should be located [6].

$$Z_s(s) = \frac{V(s)}{I_s(s)} \qquad (1)$$

$$Z_L(s) = \frac{V(s)}{I_L(s)}$$

Impedance Measurement at AC Interfaces

Figure 2:
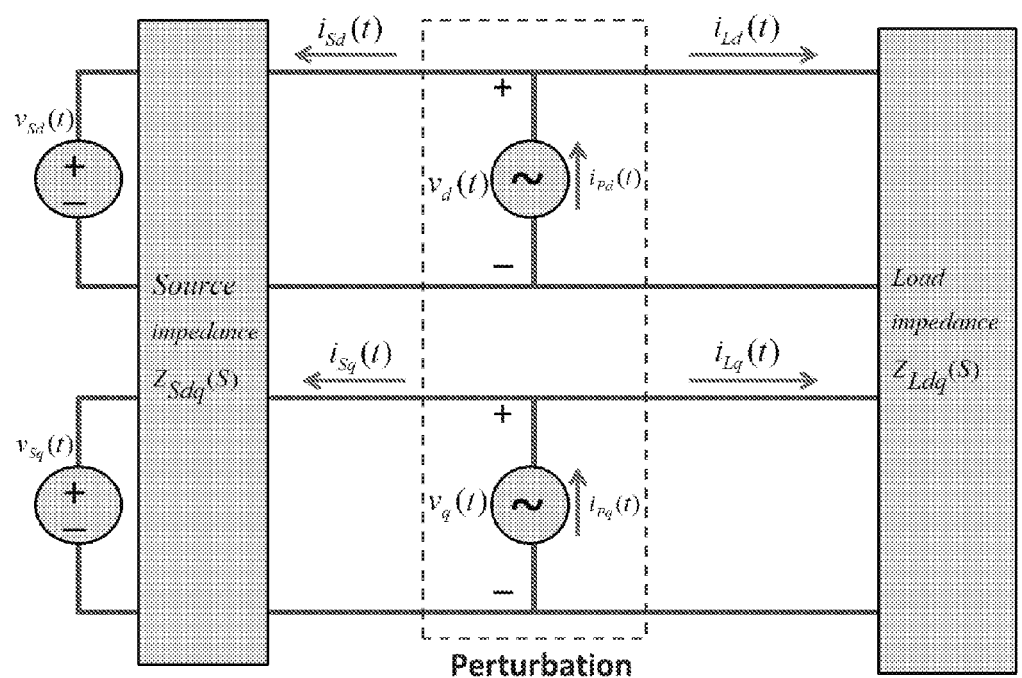
FIG. 2 is a schematic of a circuit diagram of a circuit for impedance measurement technique in an AC system and in the d-q reference frame.

In order to avoid dealing with sinusoidal values in AC systems, the AC system stability analysis may be conducted in the d-q reference frame. Thus, there will be constant values at the synchronous frequency. In the balanced three-phase systems, due to the zero magnitude of the zero components, two components should be considered for further analysis. The basic algorithm for such systems is similar to DC systems. The difference in the present disclosure is that for AC systems two independent perturbations are required. FIG. 2 depicts an AC system which is considered in the d-q reference frame [6]. Subsequent to perturbations, the responses are measured at the interface and the impedance calculated by Equations 2 through 4.

$$\begin{bmatrix} V_{d1}(s) \\ V_{q1}(s) \end{bmatrix} = \begin{bmatrix} Z_{Sdd}(s) & Z_{Sdq}(s) \\ Z_{Sqd}(s) & Z_{Sqq}(s) \end{bmatrix} \begin{bmatrix} I_{Sd1}(s) \\ I_{Sq1}(s) \end{bmatrix} \qquad (2)$$

$$\begin{bmatrix} V_{d2}(s) \\ V_{q2}(s) \end{bmatrix} = \begin{bmatrix} Z_{Sdd}(s) & Z_{Sdq}(s) \\ Z_{Sqd}(s) & Z_{Sqq}(s) \end{bmatrix} \begin{bmatrix} I_{Sd2}(s) \\ I_{Sq2}(s) \end{bmatrix} \qquad (3)$$

$$Z_{Sdq}(s) = \begin{bmatrix} Z_{Sdd}(s) & Z_{Sdq}(s) \\ Z_{Sqd}(s) & Z_{Sqq}(s) \end{bmatrix} = \begin{bmatrix} V_{d1}(s) & V_{d2}(s) \\ V_{q1}(s) & V_{q2}(s) \end{bmatrix} \begin{bmatrix} I_{Sd1}(s) & I_{Sd2}(s) \\ I_{Sq1}(s) & I_{Sq2}(s) \end{bmatrix}^{-1} \qquad (4)$$

Generalized Nyquist Criterion

The Nyquist criterion is one of the most popular criteria for stability analysis of the linear systems. The extension of it to the nonlinear systems is known as generalized Nyquist criterion which facilitates stability study of the nonlinear systems. Generally, in order to investigate stability of the systems required information from the system has to be captured and afterward the stability of the system with generalized Nyquist and/or any other criterion may be assessed.

In the 1970s, the theory of Nyquist stability was extended to a generalized Nyquist criterion by MacFarlane and Postlethwaite. Essentially, the generalized Nyquist criterion addresses matrix transfer functions and it could be used to differentiate the stability of the systems under different loading conditions [7].

Using diverse techniques and methods, final stability evaluation of the linear systems has been done based on the Nyquist criterion. Generally, in these methods state equations are utilized to study stability of the systems. Essentially, the small-signal stability of the system can be analyzed by evaluating the eigenvalues of the Jacobean matrix of the system equations. In general, in these methods the system equations are linearized to obtain the state equations for a single operating point. Therefore, these equations and (as a result) corresponding eigenvalues cannot represent all the characteristics of the systems. Consequently, these techniques by and large may be applied for operational stability studies.

On the other hand, in a more advanced technique the state equations and corresponding eigenvalues are obtained in different sets of operating conditions which can be utilized to facilitate stability assessment of the systems in more general and adequate forms. Basically, in generalized Nyquist criterion, nonlinearities of the PECs may be captured by taking into account every possible operating point of the systems. Subsequently, by satisfying stability condition for generalized Nyquist criterion, small-signal stability of the system can be guaranteed for all operating points. This method was commonly utilized for preoperational (design) purposes [8]-[11]. Basically, in this technique by considering the range of source impedance, the range of load admittance of the system in order to maintain in a stable region may be determined.

Figure 3:
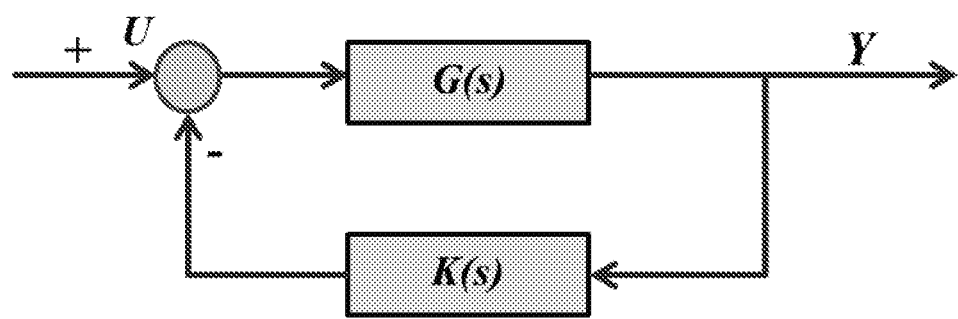
FIG. 3 is a schematic diagram of a general feedback system.

A general model of the feedback system is illustrated in FIG. 3. The output of this system is given by Equation 5:

$$y(s) = [I + G(s) \cdot K(s)]^{-1} \cdot G(s) \cdot u(s) \qquad (5)$$

This system will be closed-loop stable if the number of RHP of the G(s) and K(s) is equal to the counter-clockwise encirclements around point (−1+0j) of the Nyquist contour of the open-loop transfer function, assuming all the modes of the open-loop systems are controllable and observable, and the characteristic loci of return ratio could be defined as the graphs of $\lambda_r(s)$ (the eigenvalues of the L(s)=G(s).K(s)). Consequently, $1 + \lambda_r(s)$ is the eigenvalue of the 1+L(s). Therefore, for the every encirclement of the point −1+j0 by the Nyquist contour there will be an eigenvalue on the RHP. The proof of the duality for the eigenvalue theorem and generalized Nyquist theorem is treated in great detail in [7] by discussing the stability study results for a case study.

Small-Signal Stability Method

Various embodiments determine the small-signal stability of the PECs while they are operating. This technique is based on the ac d-q impedance measurement theory (in the operational stage as opposed to design stage), and utilizes GNC to assess the stability of the systems; however, the perturbations are in a range of frequencies instead of solely system's fundamental frequency. In various embodiments, the frequencies may range from about 0.1 Hz to about 1000 Hz. By using generalized impedance and admittance concepts (perturbing the system in a range of frequencies), it is possible to utilize Nyquist immittance criterion for local and regional operating points of the system; whereas the impedance $Z_s(s)$ (or admittance $Y_f(s)$) is a unique complex number at any given frequency. Herein, since it is desirable to monitor a system's stability while it is operating and at any given time, the system has to be perturbed persistently and by utilizing the system's response to the perturbations, $Z_{Sdq}$ and $Y_{Ldq}$ could be calculated in a time-domain. Afterward, it is possible to transfer time-domain results to the frequency-domain by fast Fourier transforms (FFTs) and monitor the system's stability by employing GNC. One of the advantages of various embodiments over the prior art is the capability to define relative stability of the systems and compare it with the instability borders to define absolute and relative stability status of the systems.

Constant power nature of the PECs with regulated output voltage might cause the instability of the PEDS due to the negative impedance at the terminals [1], [2], and [13]. Various embodiments determine the small-signal stability of the PECs through their ac interfaces. As it was well-described in section III, in order to measure generalized source/load impedances of a system in ac interface, the system should be perturbed in range of frequencies and the system's response should be transferred to the d-q reference frame. Generally, d-q representation of the system facilitates stability analysis of the PECs through ac interfaces.

Various embodiments determine the small-signal stability of the PECs while they are operating. This technique is based on the ac d-q impedance measurement theory (in the operational stage as opposed to design stage), and utilizes GNC to assess the stability of the systems; however, the perturbations are in a range of frequencies instead of solely system's fundamental frequency. By using generalized impedance and admittance concepts (perturbing the system in a range of frequencies), it is possible to utilize Nyquist immittance criterion for local and regional operating points of the system; whereas the impedance $Z_s(s)$ (or admittance $Y_f(s)$) is a unique complex number at any given frequency. Herein, since it is desirable to monitor a system's stability while it is operating and at any given time, the system has to be perturbed persistently and by utilizing the system's response to the perturbations, $Z_{Sdq}$ and $Y_{Ldq}$ could be calculated in a time-domain. Afterward, it is possible to transfer time-domain results to the frequency-domain by FFTs and monitor the system's stability by employing GNC.

The constant power nature of the PECs with regulated output voltage might cause the instability of the PEDS due to the negative impedance at the terminals [1], [2], and [13]. Various embodiments may determine small-signal stability of the PECs through their ac interfaces. In order to measure generalized source/load impedances of a system in ac interface, the system should be perturbed in range of frequencies and the system's response should be transferred to the d-q reference frame. Generally, d-q representation of the system facilitates stability analysis of the PECs through ac interfaces.

In order to explain the concept and subsequently the mathematics behind various embodiments, the generalized Nyquist stability theorem is restated herein. Considering the general feedback system shown in FIG. 3, where G(s) and K(s) are a pair of multivariable systems and their linear behavior can be represented by the state-space Equation (6):

$$\frac{dX}{dt} = Ax + Bu \quad (6)$$
$$y = Cx + Du$$

Subsequently, the corresponding transfer function matrix T with inputs u and outputs y can be described as presented in Equation 7:

$$T = C[sI-A]^{-1}B + D \quad (7)$$

Various embodiments investigate small-signal stability of the PEDS through the AC interface of the PECs. As stated previously, constant power nature of converter loads with regulated output voltage might result in negative impedance at the terminals and subsequently instability of the system. Furthermore, the d-q representation of the system facilitates small-signal stability analysis of the PECs through AC interfaces. This reference frame may be used to convert sinusoidal variables into constant quantities.

Figure 4:
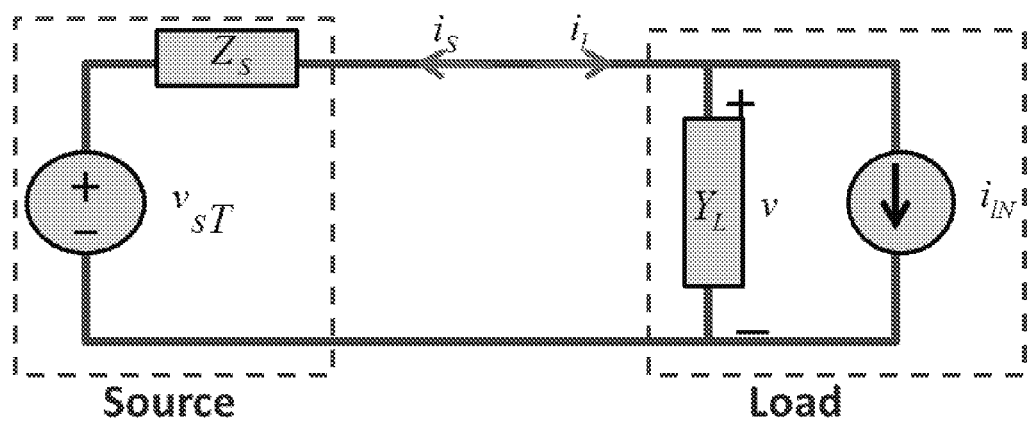
FIG. 4 is a schematic of a circuit diagram showing an interconnected source-load representation of a power electronic-based distribution system.

FIG. 4 illustrates a simplified d-q frame model of a PEC with AC source/load through its AC interface. It is relatively straightforward to determine the terminal voltage $V_{dq}(s)$ by utilizing basic circuit analysis techniques.

Equation 8 represents the transfer function from source voltage to terminal voltage.

$$V_{dq}(s) = Z_{Ldq}(s)[Z_{Sdq}(s) + Z_{Ldq}(s)]^{-1}V_{Sdq}(s) \quad (8)$$

Equation 8 may be simplified as shown in Equation 9.

$$V_{dq}(s) = [1 + Z_{Sdq}(s) \cdot Y_{Ldq}(s)]^{-1}V_{Sdq}(s) \quad (9)$$

The output of the general model of the feedback system shown in FIG. 3 may be expressed by closed-loop transfer function of Equation 10.

$$y(s) = [1 + G(s) \cdot K(s)]^{-1} \cdot G(s) \cdot u(s) \quad (10)$$

The small-signal stability of the closed-loop system of Equation 10 may be determined by directly studying the return-ratio matrix defined by Equation 11.

$$L(s) = G(s) \cdot K(s) \quad (11)$$

By analogy, the stability of Equation 9, which represents voltage stability of the d-q frame model of a PEC with AC source/load, may be determined by studying its return-ratio matrix through its AC interface as presented in Equation 12.

$$L_{dq}(s) = Z_{Sdq}(s) \cdot Y_{Ldq}(s) \quad (12)$$

Based on generalized Nyquist stability criterion, the transfer function represented by Equation 10 is closed-loop stable if the net sum of counter-clockwise encirclements around point (−1+0j) by the set of characteristic loci of $L(s) = G(s) \cdot K(s)$ is equal to the total number of RHP poles of G(s) and K(s). It is noteworthy to mention, for the system of FIG. 3, all the modes of the open-loop systems are assumed to be controllable and observable. By analogy Equation 9, which represents the transfer function (from source voltage to terminal voltage) of the general d-q model of a PEC, is stable if the roots of Equation 13 have negative real parts.

$$\det(1 + Z_{Sdq}(s) \cdot Y_{Ldq}(s)) = 0 \quad (13)$$

This condition could be interpreted by Nyquist stability criterion to formulate stability assessment of the PECs during the operational stage by preventing encirclements around point (−1+0j) for the Nyquist diagram of $Z_{Sdq}(s) \cdot Y_{Ldq}(s)$ in the complex plane. Furthermore, for the closed-loop systems, the condition could be utilized in combination with the Middlebrook's stability criterion to formulate Gain Margin (GM) stability criterion for the PECs. Although the GM stability criterion is a slightly conservative criterion, it is easier to implement. Basically, it restricts the Nyquist diagram of $Z_{Sdq}(s) \cdot Y_{Ldq}(s)$ to lie within the unit circle in the complex plane. In this criterion, only the GM of the systems is taken into account regardless of the Phase Margin (PM) values. Therefore, the stability condition of Equation 13, driven from the AC interface of the interconnected source-load PEC, is a general stability condition in the d-q frame that depends on the stability criteria and/or technique may address the stability of the PEDS for both preoperational and operational stages with different degrees of the conservativeness.

Herein, the general stability term of Equation 13 is measured with the GM criterion in order to ensure the overall small-signal stability of the system. Additionally, in order to find a return-ratio matrix of the system in a more convenient manner, some legitimate modifications and simplification are considered as well. In the literature these simplifications mainly are considered in impedance measurement techniques for high power factor rectifiers [12].

Generally, the stability at the AC interfaces feeding high power factor rectifiers could be assessed with Generalized Nyquist criterion by applying it to the return-ratio matrix $L_{dq}(s)$ as determined by equation 14.

$$L_{dq}(s) = Z_{Sdq} \cdot Y_{Ldq} = \begin{bmatrix} Z_{Sdd}(s) & Z_{Sdq}(s) \\ Z_{Sqd}(s) & Z_{Sqq}(s) \end{bmatrix} \cdot \begin{bmatrix} Y_{Ldd}(s) & Y_{Ldq}(s) \\ Y_{Lqd}(s) & Y_{Lqq}(s) \end{bmatrix} \quad (14)$$

In [12] it was proven that "all constant power load dynamics are reflected on the d-d channel." Therefore, for high power factor rectifiers, it is acceptable to neglect all the other channels of input admittance ($Y_{Ldq}$) in the return-ratio matrix calculation. Consequently, Equation 14 is derived as presented in Equation 15.

$$L_{dq}(s) \approx \begin{bmatrix} Z_{Sdd}(s) & Z_{Sdq}(s) \\ Z_{Sqd}(s) & Z_{Sqq}(s) \end{bmatrix} \cdot \begin{bmatrix} Y_{Ldd}(s) & 0 \\ 0 & 0 \end{bmatrix} \approx \begin{bmatrix} Z_{Sdd}(s) \cdot Y_{Ldd}(s) & 0 \\ Z_{Sqd}(s) \cdot Y_{Lqd}(s) & 0 \end{bmatrix} \quad (15)$$

$$\approx \begin{bmatrix} l_1(s) & 0 \\ l_2(s) & 0 \end{bmatrix}$$

In addition, it was proven in [5] that in this condition, the small-signal stability at the input terminals of the multi-pulse rectifier is determined by the characteristic loci described by the eigenvalues of the corresponding return-ratio matrix $L_{dq}(s)$. Given the input dynamics of the rectifier, the eigenvalues of $L_{dq}(s)$ at the AC interface are given by Equation 15. Consequently, only the eigenvalue associated to the d-d channel (i.e., $l_1(s)=Z_{Sdd}(s) \cdot Y_{Ldd}(s)$) can actually encircle the critical point (−1+j0), and thus be the cause of instability. The remaining eigenvalue associated to the q-d channel, $l_2(s)=Z_{Sqd}(s) \cdot Y_{Ldd}(s)$, was shown to remain stationary at the origin of the complex plane and therefore be incapable of causing instabilities [12]. Therefore, in various embodiments, the Nyquist contour of the $l_1(s)$ is determined and examined for the Nyquist evaluation instead of any other criteria such as GM or Middlebrook.

The next step is defining $l_1(s)$ from the model. In various embodiments, the current injection method [13] is used to define the return-ratio matrix of a PEC. In this method the currents are injected through the AC interface of the system, with the magnitude of around 100 of the system's current. The frequency of the injected current is the harmonics of the fundamental frequency (60 Hz) and up to $15^{th}$ harmonics (900 Hz). The main reason for injecting current in the range of frequencies is to perturb system in the same range of frequencies. By this procedure, it is likely to capture most parts of the system's nonlinearities through a linear model. Due to the various frequencies, the injected currents are sinusoidal in the d-q synchronous reference frame with the frequency of the system. Considering signal injection methods utilized in the DC interfaces in [6] and [14], this method depicts similar behavior in the d-q synchronous reference frame with the system's frequency of $\omega_s$. Furthermore, by utilizing FFTs in the model, the magnitude of the systems responses to the perturbations is measured. It is noteworthy to mention that the GM criterion solely needs the magnitude of the responses as an input. Conversely, in other criteria the phase of the responses might be required, where the PM should be considered in addition to GM.

It is noteworthy to mention that complete Nyquist contour of $l_1(s)$ is considered unlike the Middlebrook (and GM) method used in [26]; in which solely magnitudes of the components of the return-ratio matrix were considered (according to Equation 31). Therefore, in order to achieve the Nyquist contour the phase of $l_1(s)$ should be obtained from the model. This method enhances the degree of accuracy of the method by diminishing the degree of conservativeness. Therefore, the Nyquist contour can be sketched in the S-plane by Equation 16.

$$l_1(s)=Z_{Sdd}(s) \cdot Y_{Ldd}(s)=|l_1(s)|\sin \sphericalangle l_1(s)+j|l_1(s)|\cos \sphericalangle l_1(s) \quad (16)$$

Figure 5:
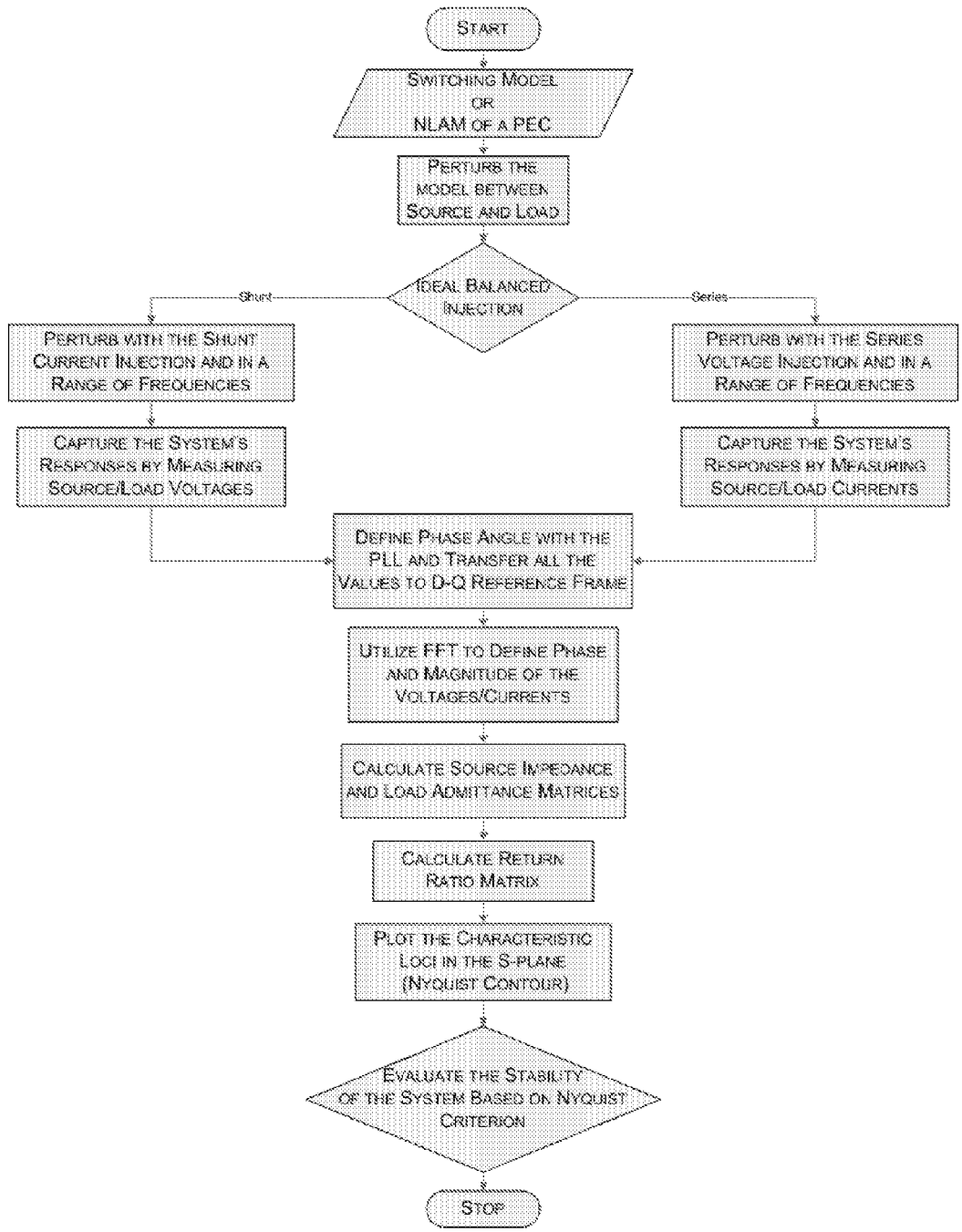
FIG. 5 is a flowchart for an algorithm of a stability control method.

FIG. 5 depicts different stages and algorithm of various embodiments of the small-signal stability technique. In the model validation section the difference between degree of conservativeness and accuracy of the GM and various embodiments is shown by a sample stability analysis test case which the results from unit circle criterion shows unstable system, whereas the system is stable in the time-domain simulation which may be verified by various embodiments.
Model Validation and Sample Stability Analysis The stable system itself can be divided into asymptotic and marginal stability. Herein, all three possible types of stability are studied in the test system in order to reveal the capability of various embodiments to address the stability condition of the systems.

According to various embodiments, the average value model of a SST [15] was used as a test system in order to facilitate model verification. The models for the SST and also stability analysis blocks were developed in PSCAD. One of the most significant advantages of various embodiments is that it allows systems to be studied while they are operating. Furthermore, the return-ratio matrix may be utilized as an indicator of stability which depicts the margin of the system to the instability borders. Therefore, by extension of this method to the real-time applications the stability of the PEDS can be comprehensively studied during their operation.
System with Asymptotic Stability In order to validate the method in the stable conditions, a single phase SST was connected to the ideal source from the primary side and a RL load was connected to the secondary side of the SST. The high-voltage and low-voltage levels of the SST were 7.2 kV and 120 V respectively and 1.534+j0.753Ω was the initial load of the system. The simulations ran for a 1s and with 50 μs time-steps. The time-domain simulation results in FIGS. 6A and 6B depict that the system was stable. On the other hand, FIG. 6C reveals that the magnitude of the d-d component of the $L_{dq}(s)$ matrix ($Z_{Sdd}(s).Y_{Ldd}(s)$) was significantly less than 1, which according to the stability criterion not only was the system stable, but also this stable region was far away from the instability margin.

System with Marginal Stability

For the further study of various embodiments in the sensitive and critical situations, the RL load connected to the test system was reduced to 10% of its initial value. FIGS. 7A and 7B present the time-domain results for the voltage and current of the secondary side. As illustrated in FIG. 7B, this caused the current of the LV side of the system to increase by a factor of 10 and subsequently caused the test system to become closer to the instability margin. The marginal stability condition in various embodiments may be interpreted by the magnitude of the d-d component in the return-ratio matrix. Thus, the system is marginally stable while it is equal to one. FIG. 7C depicts that the stability criterion was close to 1 and, therefore, the test bed in this condition was close to instability margin.

Small-Signal Stability Study of the Instable System

For the systems with the magnitude of $Z_{Sdd}(s) Y_{Ldd}(s)$ in the return-ratio matrix greater than one, the system was instable. Herein, connected RL load to the SST decreased to 1% of its initial value, which caused the instability in the system. This instability was observed from time-domain data shown in FIGS. 8A and 8B. The stability criterion of the developed technique (FIG. 8C) verified this fact while the magnitude of the d-d channel of the return-ratio matrix is greater than one.

Small-Signal Impedance Measurement-Based Techniques—Real-Time Application—Operational Stage The methods described above may be extended to the operational (real-time) stage. It is possible to extend the design stage methods to real-time stability assessment applications by taking advantage of real-time platforms such as Real-Time Digital Simulator (RTDS) or Hardware-in-the-Loop (HIL) simulation. For this purpose, an impedance measurement-based technique was utilized to define the source impedance and load admittance. Subsequently, the small-signal stability of the system was investigated by GNC utilizing obtained source/load impedances of the system.

Stability study for power systems may be categorized into three different stages with respect to operating time: preoperational, operational, and post-operational stages. Conversely, from the system's topology viewpoint, the stability of the systems may be divided into three types: steady-state, small-signal, and large-signal stability analyses [3]. Steady-state analysis is the initial step to approach a system stability study that provides significant understanding of the system behavior during normal operation. In the conventional power system stability studies, stability from a steady-state viewpoint is utilized [4].

The small-signal analysis is the next step in a system stability study while steady-state stability of the systems is provided. Small-signal stability is defined in [16] as: The capability to return to the identical stable operating point after the occurrence of a disturbance that leads to any changes in one or more of the state variables of a PEDS. In the small-signal analysis, stability of the systems will be investigated around the desirable operating point. Generally, a system might operate in various equilibrium points of interest. In this condition, in order to ensure overall stability of the system, small-signal stability has to be addressed at each equilibrium point. Small-signal stability techniques are mainly developed based on average linearized models around the equilibrium points which allows utilizing different analytical tools that can assist in the study, such as Nyquist, Bode, and Root locus plots. One common technique for small-signal stability assessment of the PEDS uses Middlebrook's criterion [5] to ensure stability of the systems by surrounding the Nyquist contour of $Z_{source}(s)/Z_{load}(s)$ in the unit circle in the s-plane. Small-signal stability assessment may be utilized for both design and operational purposes. There are several criteria and techniques that were developed based on Middlebrook's criterion [5] in the associated research. Essentially, these methods are different in the degree of conservativeness in the design process of the PEDS.

Several methods for the purpose of control design were investigated in [8]-[11], [17]. By and large, these methods ensure the system's stability by preventing encirclement of the $(-1+j0)$ point by the Nyquist contour of $Z_s$. $Y_l$. The first method is based on the Middlebrook criterion, which consists of a circle of radius 1/GM in the s-plane; where GM is Gain Margin (GM). For a given $Z_s$, this design criterion provides constraints for an allowable range of $Y_l$ as shown in Equation 17.

$$|Y_l| < \frac{1}{|Z_s|GM} \quad (17)$$

Obviously, with this constraint the Nyquist plot of $Z_s$. $Y_l$ is always within the circle. Therefore encirclements of the $(-1+j0)$ point cannot occur provided that GM is greater than 1. Due to an infinite Phase Margin (PM) demand, this method is likely to force artificially conservative designs.

One of the most well-known techniques associated with the small-signal stability analysis is the eigenvalue-based technique. This method has been used for the design of controllers to improve small-signal stability of the PECs in [18]-[21]; however, this technique is not practical for investigating the stability of the large scale power systems or PEDS. Lyapunov techniques have been utilized for design purposes in large-scale stability assessment of specific types of PECs in [1], [22], and [23] as well as small-signal in [18]. Since these methods addressed particular devices, they are not generic methods to be utilized for stability study of the PEDS.

The small-signal stability assessment based on the impedance measurement technique and Nyquist criterion presented herein has two significant advantages over aforementioned techniques. The first advantage is the capability of this technique to be developed for real-time applications. Although real-time small-signal stability assessment of the PEDS is an extremely significant subject, it has not been addressed so far. By increasing penetration of PECs in the smart grids, steady-state stability analysis cannot ensure the overall stability of system. Small-signal stability of a system during operation has to be investigated as well to prevent instabilities in distribution and sub-transmission levels of the power systems. Another advantage of various embodiments is simplicity of developing a powerful algorithm and diminishing artificial conservativeness in previously developed methods simultaneously. In this method, several dominant concepts from previously developed stability techniques are utilized and by taking advantage of math, the proposed algorithm is modified to facilitate implementation. At the same time, this method by addressing the actual Nyquist contour, instead of other stability criteria, removes all the artificial conservativeness of prior art methods.

Nyquist Immittance Criterion for the PECs

Generalized Nyquist evaluation was applied to the power system analysis as well as several other applications. The interconnected (source-load) PEC is illustrated in FIG. 4.

Using circuit analysis techniques, the terminal voltage v is given by Equation 18.

$$v = \frac{v_{sT} - Z_s \cdot i_l}{1 + Z_s \cdot Y_l} \quad (18)$$

Equation 18 represents that the open-loop transfer function of the interconnected source-load system (FIG. 4) is stable, if $1+Z_s \cdot Y_l$ does not have any zeros in the closed RHP. Thus, by analogy, and utilizing GNC aforementioned system is stable provided that the Nyquist evaluation of $Z_s \cdot Y_l$ does not encircle (−1+j0) in the S-plane [24]. From the Nyquist theorem and considering a transfer function with $1+G(s) \cdot K(s)$ as its denominator, the number of unstable closed-loop poles for the system is equal to the number of unstable open-loop poles added to the number of CW encirclements of the point (−1+j0) by the Nyquist evaluation of $G(s) \cdot K(s)$ on the Nyquist contour. By analogy, the number of unstable closed-loop poles in the aforementioned system with $1+Z_s \cdot Y_l$ in the denominator is equal to the number of unstable open-loop poles of $Z_s \cdot Y_l$ (which in our case is zero since the assumption is that stand-alone source and load are stable) added to the number of CW encirclements of the Nyquist evaluation of $Z_s \cdot Y_l$. Thus, the number of unstable closed-loop poles is equal to the number of CW encirclements of the point −1+j0 by the Nyquist contour of $Z_s \cdot Y_l$. Therefore, a source-load system is stable if and only if the Nyquist evaluation of $Z_s \cdot Y_l$ does not encircle the point (−1+j0) in the S-plane [8], [9].

Practical Considerations

Figure 9:
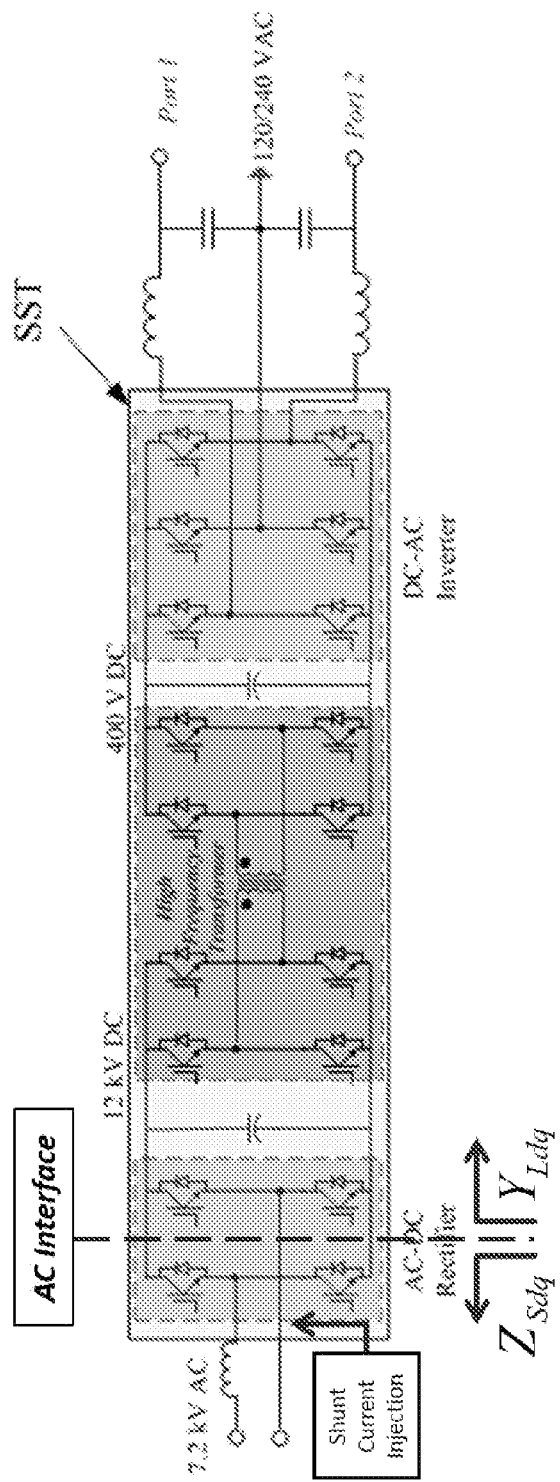
FIG. 9 is a schematic of a circuit diagram of a solid state transformer used as a sample power electronic-based component with a source-load interface.

In order to verify various embodiments, an average value model of a SST [15] was used. The STT model and all the required blocks to achieve return-ratio matrix and its Nyquist contour are developed into the PSCAD platform. Various embodiments may be based on impedance measurement technique and shunt current injection method, which in the shunt current injection method the perturbations are made by injecting current into the systems. The first part is perturbing system in a range of frequencies; this has been done by "injection current harmonics" in PSCAD. Basically, this part is for perturbing the system in a range of frequencies. The harmonic current magnitude is about 5% of the fundamental current magnitude and its frequency is in a range of 60-900 (Hz) with the increment of 60 (Hz) in various embodiments. In other words, the injections are up to $15^{th}$ harmonics of fundamental frequency. In certain embodiments, the magnitude of the injected current ranges from about 0.5 percent to about 1 percent of a nominal current of the power system. The system's voltages are measured in the source and load interfaces (FIG. 9). Subsequently, by single-phase Phase Lock Loop (PLL) the system's phase is obtained and utilized to transfer load/source voltages and currents to the d-q reference frame. FFT analysis is used to transfer time-domain data to frequency-domain data. Using the FFT's outputs and based on Equations 2-4, it is possible to find the source/load impedance matrices in the d-q reference frame. The small-signal stability technique proposed in [26] solely utilized magnitudes of the return-ratio matrix. This criterion ensures the small-signal stability of the systems while the magnitude of the $l_1(s)$ is less than one. Criterion of various embodiments diminishes the degree of conservativeness, for instance, for the system with the $|l_1(s)|$ greater than unit that never encloses point −1+j0 this criterion considers it as unstable; however in reality this system is stable. The reason is that it restricts the Nyquist contour of the return-ratio in the unit circle, whereas in the GNC, the Nyquist contour for the stable cases should not encircle −1+j0 point. It is obvious by preventing Nyquist contour of the return-ratio to pass unit circle, it never encircles −1+j0 point and the system remains stable. In various embodiments, the phase of the return-ratio is also taken into the account. This means that the complete Nyquist contour of the system is obtained by Equation 16. This will assist to find more precise results with less conservativeness. In the following section, a case study is shown which based on the GM criterion it is unstable but in reality it is stable with lots of harmonics distortion. In addition, it is shown that by utilizing GNC of the $l_1(s)$, the stability of the system is well-studied in all different conditions.

Model Validation and Sample Analysis

The small-signal stability of a sample PEC was studied and for both stable and unstable conditions. The stable situation, itself, can be divided into asymptotic and marginal stability. Herein, in order to illustrate the capability of various embodiments to address the small-signal stability condition of the systems, all three possible types of stability were studied with the test system and by instantiating three different case studies. In addition, the results were compared to the impedance measurement-based method with utilizing unit circuit criterion that was applied in [26], which solely GM has been considered in that method, to depict the degree of accuracy in various embodiments.

A sample PEDS was modeled with a SST connected to the IEEE-34 bus test system in source interface and load (FIG. 9) and stability of the system is investigated through ac interface inside the SST. The test bed as well as stability analysis blocks were developed in PSCAD. One of the most significant developments observed for various embodiments over other prior art techniques is its capability to address the small-signal stability of the systems while they are operating. This can be extended to real-time stability assessment. Furthermore, the return-ratio matrix may be utilized as an indicator of stability that depicts boundaries of the system to the instability boarders. Therefore, by extension of this method to the real-time applications the stability of the PEDS can be comprehensively studied during their operation.

System with Asymptotic Stability

Figure 10A:
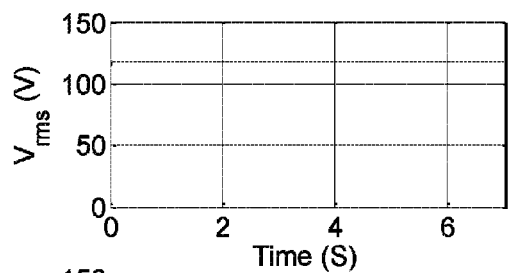
FIGS. 10A through 10D are graphs depicting simulation time-domain results for the test bed in the asymptotic stable condition.
Figure 10B:
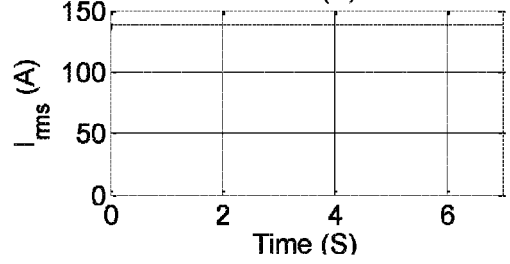
Figure 10C:
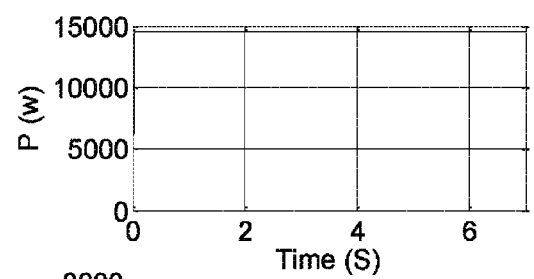
Figure 10D:
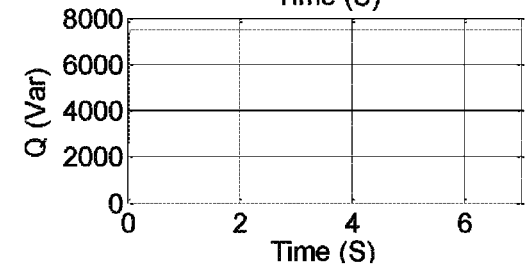

In order to validate the method in the stable conditions, a single phase SST was connected to the ideal source from primary side and a RL load was connected to the secondary side of the SST (FIG. 9). The high-voltage and low-voltage levels of the SST were 7.2 kV and 120 V respectively and 1.534+j0.753 Ω was the initial load of the system. The time-domain simulation results for RMS voltage, current, active and reactive powers in FIGS. 10A and 10B depict that the system was stable.

Figure 11:
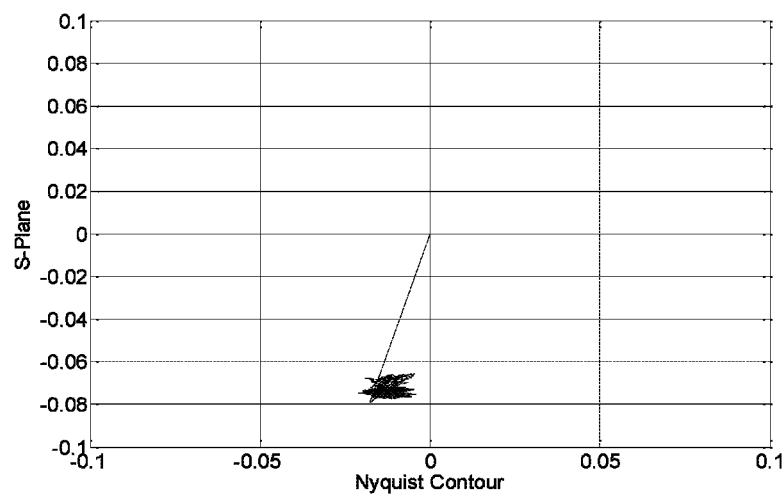
FIG. 11 is a Nyquist plot for an asymptotic stable solid state transformer connected to the RL load in the S-plane.

Furthermore, the Nyquist contour of the d-d component for the return-ratio matrix ($l_1(s)$) is illustrated in FIG. 11. Based on Nyquist evaluation the system was stable under this loading condition since the Nyquist contour does not encircle point −1+0j. From the Nyquist map it is evident that the system was far away from instability margin since the $|l_1(s)|$ component of the return-ratio matrix is significantly less than 1.

System with Marginal Stability

Figure 12A:
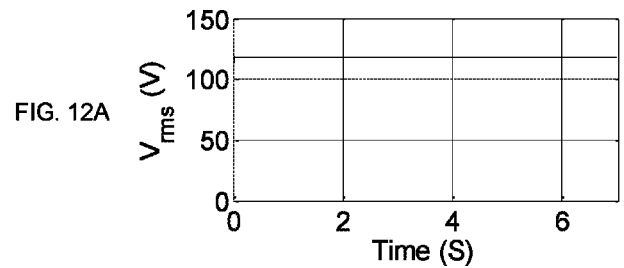
FIGS. 12A through 12D are graphs depicting simulation time-domain results for the test bed in the marginal stable condition.
Figure 12B:
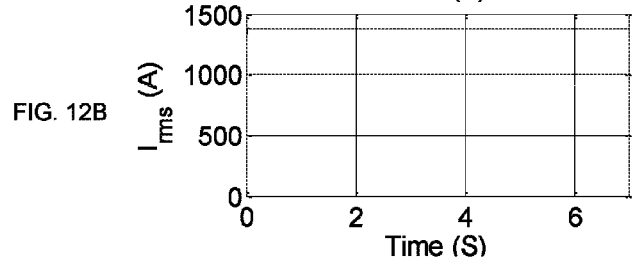
Figure 12C:
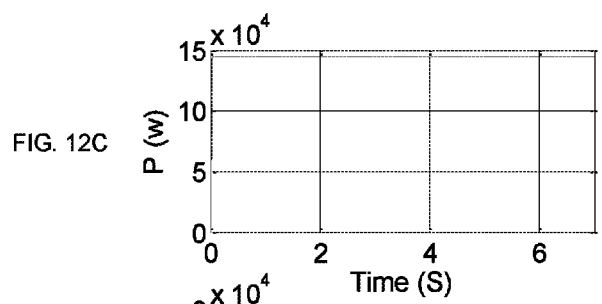
Figure 12D:
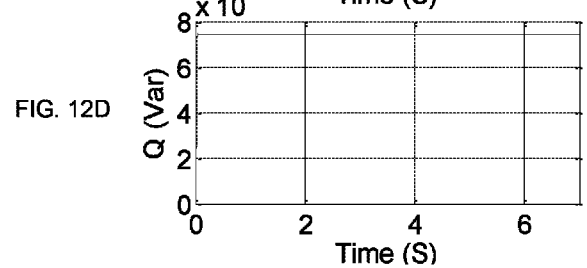

For further study of various embodiments in the sensitive and critical situations, the RL load connected to the test system was reduced to 10° % of its initial value. The RMS values for voltage, current, active and reactive power are illustrated in FIGS. 12A and 12B and reveal that system was still stable in this loading condition.

Figure 13:
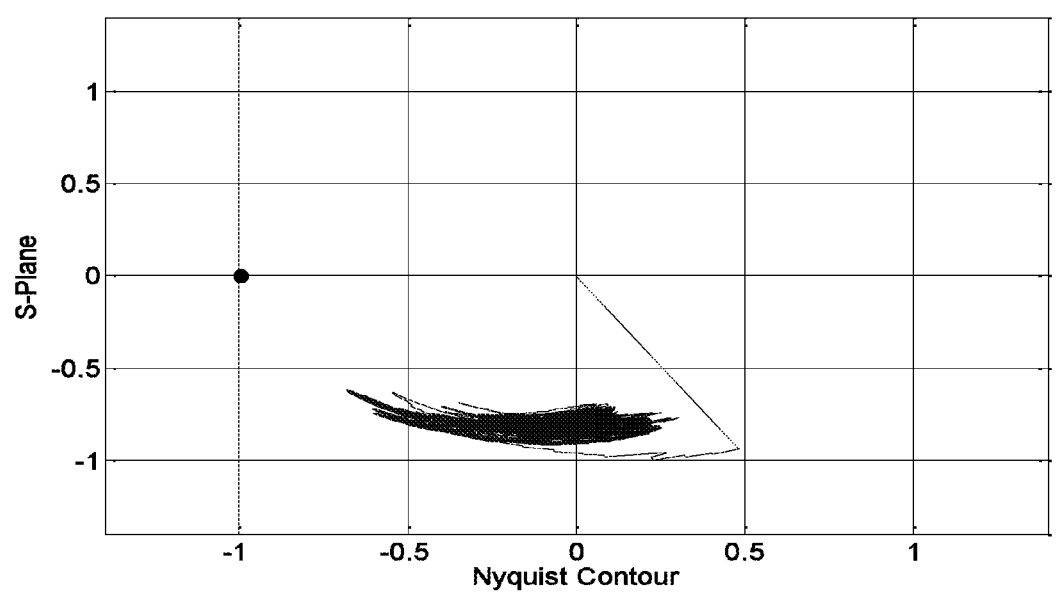
FIG. 13 is a Nyquist plot for a marginal stable system.

Furthermore, FIG. 13 shows the Nyquist contour of the $l_1(s)$ component of return-ratio matrix that verifies the stability of the system in this condition. Although $l_1(s)$ does not encircle critical point of −1+0j, its magnitude was close to unity which can be interpreted as a marginal stability based on GNC. The marginal stability condition in the various embodiments may be interpreted by the magnitude of the d-d component in the return-ratio matrix ($l_1(s)$). In other words the system is marginally stable while $|l_1(s)|$ is less than and close to 1.

Small-Signal Stability Study of the Instable System

Figure 14A:
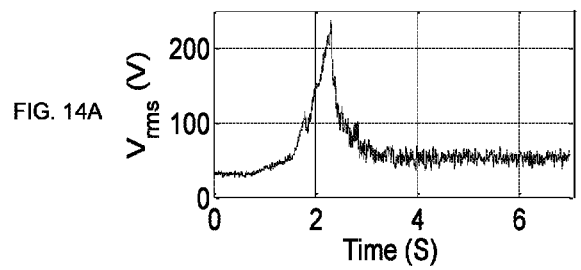
FIGS. 14A through 14D are graphs depicting simulation time-domain results for the test bed in the unstable condition.
Figure 14B:
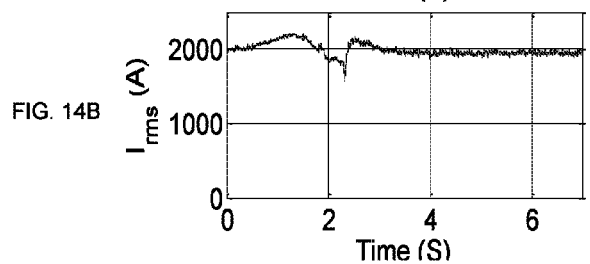
Figure 14C:
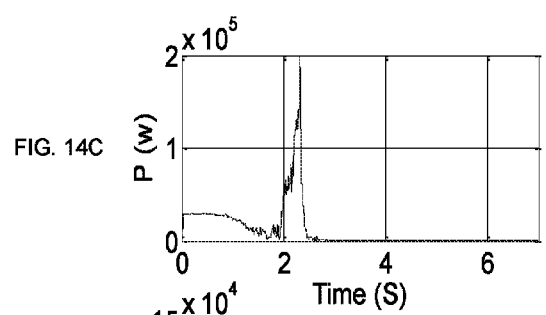
Figure 14D:
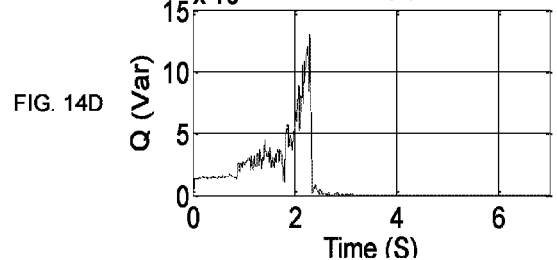

Based on unit circle criterion for the systems with the magnitude of $Z_{Sdd}(s).Y_{Ldd}$ (s) in the return-ratio matrix greater than one, the system is unstable. Moreover, this instability condition was interpreted with the GNC by encirclement of point −1+0j by the Nyquist contour of the return ratio. In this test case, connected RL load to the SST decreased to 1% of its initial value. It causes the instability in the system after almost 2 (s) of the simulation that could be observed from time-domain data shown in FIGS. 14A and 14B. The RMS values for the voltage, current, active, and reactive power in FIGS. 14A and 14B clearly depict that the complete instability and as a result systems breakdown occurs after approximately 2 s.

Figure 15:
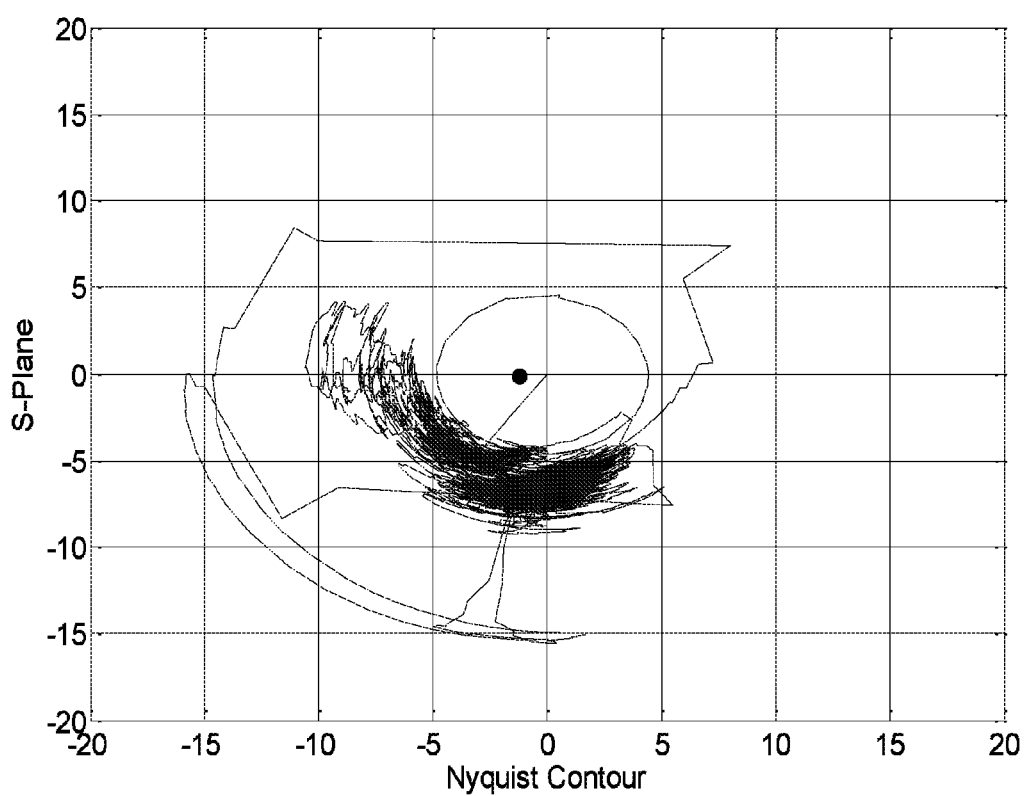
FIG. 15 is a Nyquist plot for an unstable system in the S-plane.

This fact is shown by Nyquist contour of the $l_1(s)$ in FIG. 15 as well, which, even though its magnitude is greater than unity, it does not encircled −1+0j point in the first 2 s.

Figure 16:
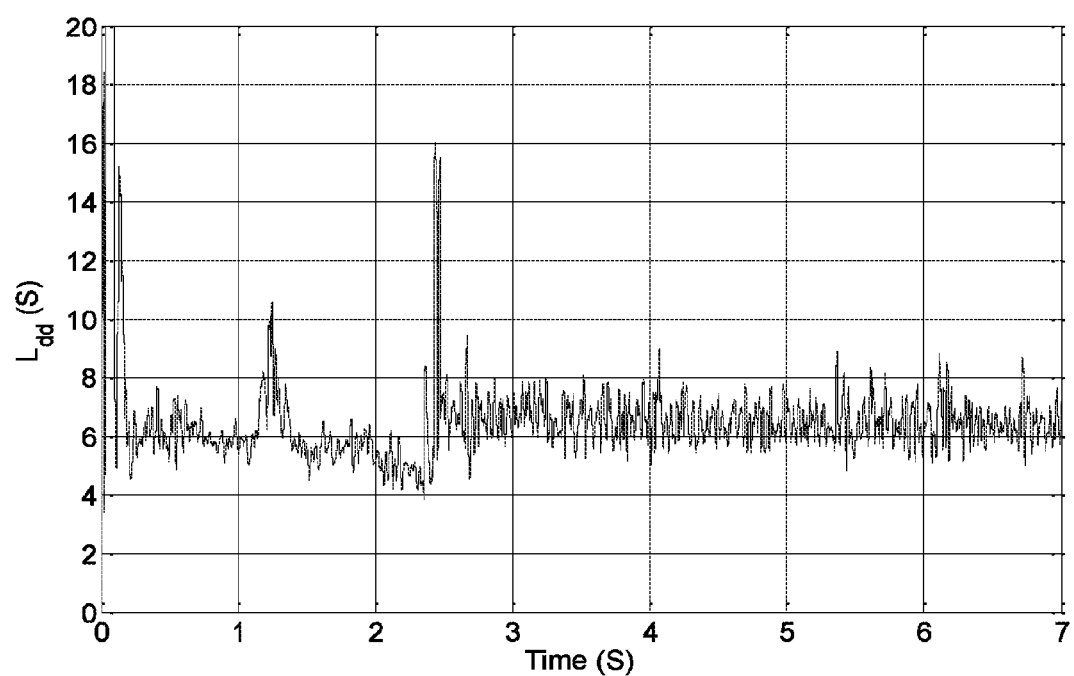
FIG. 16 is a graph of unit circuit stability criterion for the unstable case where the value of the return-ratio is greater than one.

In fact, the earliest encirclement by the Nyquist contour occurs exactly simultaneous with system's instability in the time-domain. This capability (considering the phase angle in addition to magnitude) is the dominant advantage of the GNC over unit circle criterion. As FIG. 16 displays with the unit circle criterion (GM criterion) that solely considers magnitude of the return-ratio the system was diagnosed unstable from the beginning since the return-ratio magnitude is greater than unity.

Various embodiments are effective to determine the small-signal stability of the systems while they are operating. This technique was based on the d-q impedance measurement theory (in the operational stage as opposed to design stage). Furthermore, the nonlinearities of the under test systems can be captured with this technique since the perturbations in this technique have been done by shunt current source in the range of frequencies. Moreover, in various embodiments the system has to be perturbed persistently and by utilizing the responses of the perturbations, $Z_{dqs}$ and $Y_{dql}$ and subsequently return-ratio matrix of the system can be calculated. Additionally, FFT was utilized in this method to transfer time-domain data to frequency-domain data. After obtaining magnitude and phase angle of the components of the return-ratio matrix, the small-signal stability of the PECs can be investigated through Nyquist contour and based on GNC. In various embodiments, it is possible to use magnitudes of the component and monitor the operational region's stability of the system based on unit circuit criterion. In addition, it was shown that by utilizing this method it is possible to track the stability condition of the system while it is operating. In other words, this method allows us to have a real-time stability assessment of the system while applied data are extracted from real-time simulation and/or real system.

Real-Time Applications

Practical considerations that enable real-time capability of various embodiments are presented below. These technical considerations are chirp signal excitation and parallel perturbations. In addition, the procedure of various embodiments of the method for real-time small signal stability assessment is described in different steps in order to clarify systematic development and implementation of the method as follows:

- Acquiring required information to calculate source and load impedances as described previously in each PEC by measuring voltages and currents in the source and load sides of it as well as perturbation signals.
- Defining source impedance and load admittance by d-q impedance measurement theory as described above.
- Transforming source impedance and load admittance from time domain to frequency domain with utilizing FFT.
- After defining source and load impedances in frequency domain, it is possible to calculate return-ratio matrix (production of source impedance and load admittance).
- Having the return ratio matrix in frequency domain, it is possible to identify Generalized Nyquist contour of the d-d component.
- Small-signal stability can be addressed by utilizing GNC theorem described above.

Various embodiments have the capability to assess the stability of the PECs in real-time. Furthermore, various embodiments may define relative stability of the systems by finding return-ratio matrix in the frequency domain and comparing it with the stability criterion to define absolute and relative stability status of the systems. Various embodiments represent improvements over the current state of the art by at least the following:

1. Perturbing the system with the chirp signal helps in real-time capability and nonlinearity consideration simultaneously.

2. Perturbing the system at the source interface as well as the load interface at the same time helps to gather all the required data for the impedance measurements in real-time and without interference.

Chirp Excitation Signals

Chirp signals, also known as swept-sine signals, are wide-bandwidth signals used to perturb the system for impedance measurement [27]. Various embodiments may use chirp signals for perturbation in the impedance measurement, thus simultaneously enabling real-time capability and nonlinearity consideration.

For chirp signals, the instantaneous frequency changes as a function of time. For various embodiments, the change is linear, and therefore it is referred to "linear chirp". Therefore, it is possible to perturb systems in real-time throughout a range of frequencies. Equation 19 shows the linear chirp form of the perturbation signal:

$$x(t) = A\sin\left(2\pi\left(\frac{f_0 + (f_1 - f_0)t}{2T}\right)t\right) \quad (19)$$

where x(t) could be the voltage and/or current signal, depending on the type of perturbation (series voltage and/or shunt current), A is the magnitude of the perturbation, $f_0$ is the start frequency, f1 is the end frequency, and T is the duration of the chirp signal (for real-time applications, the chirp signal is periodic and T should be reset after reaching final value).

Utilizing chirp signals to perturb a system for impedance measurement purposes facilitates perturbation of the system in a range of frequencies and in real-time simultaneously. In other techniques, in order to be able to perturb systems in a range of frequencies, the test system must be perturbed separately at each single frequency, thus preventing those techniques to be applicable for real-time applications.

Parallel Perturbations

In order to obtain the source and load impedances of a test system, perturbation is required. As previously discussed, the two types of perturbations are shunt current injection and series voltage injection [28]. The source impedances can be measured more accurately by the shunt current injection method, due to the fact that, in a normal system, since stiff output characteristic of source is preferred, source impedance is much lower than load impedance. Thus, most of the shunt current injection flows into the source side and the load side is only slightly perturbed. Conversely, series voltage injection is appropriate for load impedance measurements. Generally, in order to perturb the load side in such systems, two solutions are available: first, the insertion of a filtering impedance, which modifies the system configuration and changes the load impedance (the goal is to develop a technique to assess the stability of a PEC without changing its characteristics); second, the perturbation of the load with the series voltage injection. With the second solution, most of the injected voltage affects the load side for the same reason for the shunt current injection and considering the fact that admittances are taken into account (instead of impedances) and source admittance is much higher than load admittance).

In the prior art, one of these perturbation techniques would typically be used and the desired impedance was calculated based on the perturbations and system's responses. Afterward, with source and load impedances, stability of system was studied. However, in various embodiments, both source impedance and load admittance is calculated at the same time in order to be able to assess the stability of a system in real-time. This method is referred to as parallel perturbations. In order to measure the system impedance by parallel perturbations, the magnitude of the injected current and voltage A in Equation 19 should be between 0.5% and 1% of the system's current and voltage at the same node. With this condition held true, the power of the perturbation is enough for an appropriate measurement and the system's operation point is not changed due to high perturbation power.

Model Validation and Sample Analysis

Test System Configuration

Figure 17:
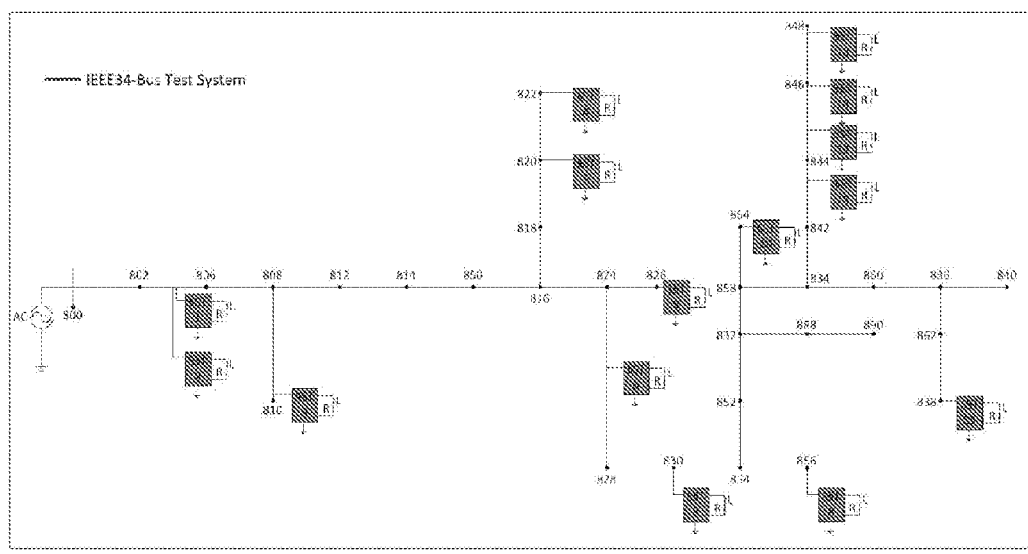
FIG. 17 is a schematic diagram of an IEEE-34 bus system with integration of SSTs in distribution level.

In order to study and verify various embodiments for real-time applications, a test system was developed in Real-time Simulator Computer Aided Design (RSCAD). The Center for Advanced Power Systems (CAPS) with 14 racks of RTDS has great capability for real-time simulation of power systems. Developed test systems on RTDS platform are a modified version of the IEEE-34 bus test system [26] in RSCAD simulation. IEEE-34 bus test system is a 24.9 kV feeder; whereas voltage level in the developed test system was scaled down to 12.47 kV. Although the voltage was scaled down, overall load of the system remained the same. The schematic of the IEEE-34 bus test system with integration of the SSTs in distribution level is shown in FIG. 17. In this test system all the loads in the original IEEE-34 were connected to the system through a SST. Basically, this system represents a small-scale PEDS (contemporary distribution systems).

In addition, a sample PEC was modeled with the average value model of a SST [30] connected to the source and load (FIG. 9) and stability of the system was investigated through the AC interface of the SST. The STT and all the required blocks to achieve return-ratio matrix in real-time were developed on the RTDS platform. The small-signal stability of a sample PEC was studied under different loading conditions that led the system into both stable and unstable conditions. One of the most significant advantages of various embodiments over other prior art developed techniques is real-time capability. Developing this technique on the RTDS platform and taking advantage of chirp signal excitation and parallel perturbations enable this characteristic. Furthermore, the magnitude of the return-ratio matrix may be employed as an indicator of stability, which depicts margins of under study systems to the instability borders. Therefore, the stability of the PEDS can be comprehensively studied in real-time.

Utilizing chirp signal to perturb systems for impedance measurement purposes facilitates to perturb systems in a range of frequencies and in real-time simultaneously. Furthermore, parallel perturbations facilitate data acquisition process for source impedance and load admittance concurrently.

Instantaneous Test Scenarios to Study Small-Signal Stability of the Test Bed Considering Interaction Between SSTs and the PEDS In this test scenario, connected RL loads to the SST 1 and SST 2 were changed. Subsequently, the influence of these changes on the both SST's active power, load current, and stability criterion were studied. This test study illustrated the ability of various embodiments to address the interaction between the PEDS and PECs. In the first test scenario, the test system operated in its normal loading condition. This means two loads of(10+j5) kVA and (15+j7.5) kVA were connected to SST1 (phases a) and SST2 (phase b) respectively. The simulation results under these loading conditions are shown in FIGS. 18A and 18B. As shown in these figures, the magnitudes of d-d channel of the return ratio matrices ($L_{dd}$) for both SSTs were less than one, which ensures stability of the SSTs in the system. Furthermore, RMS load voltages and currents are shown along with the SSTs' active power in this condition.

Figure 19B:
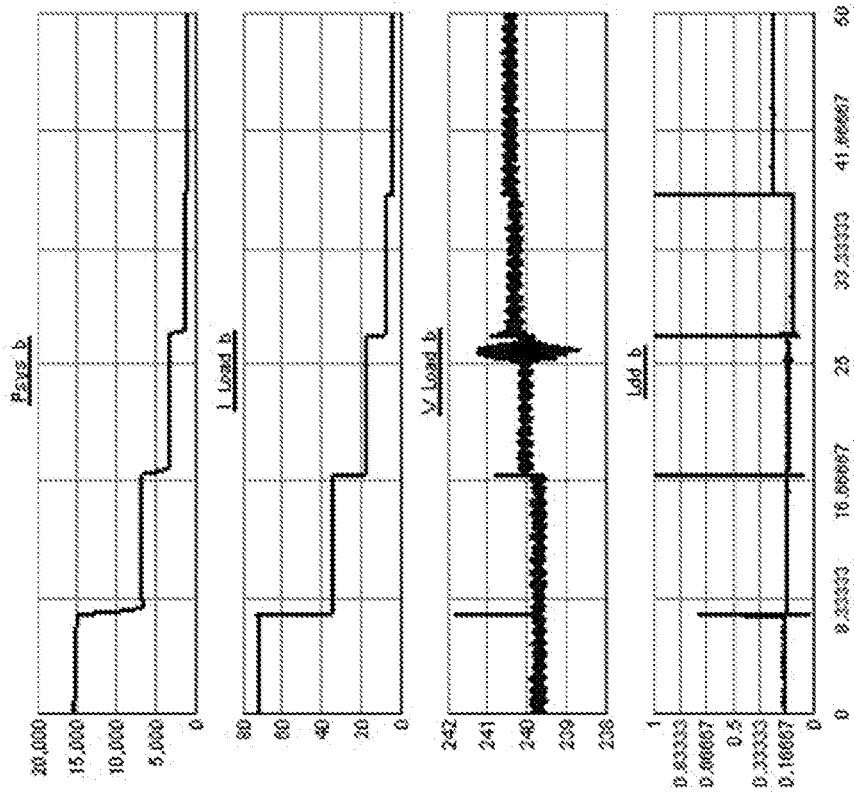
FIG. 19B is a graph of the real-time simulation results for SST2.
Figure 19A:
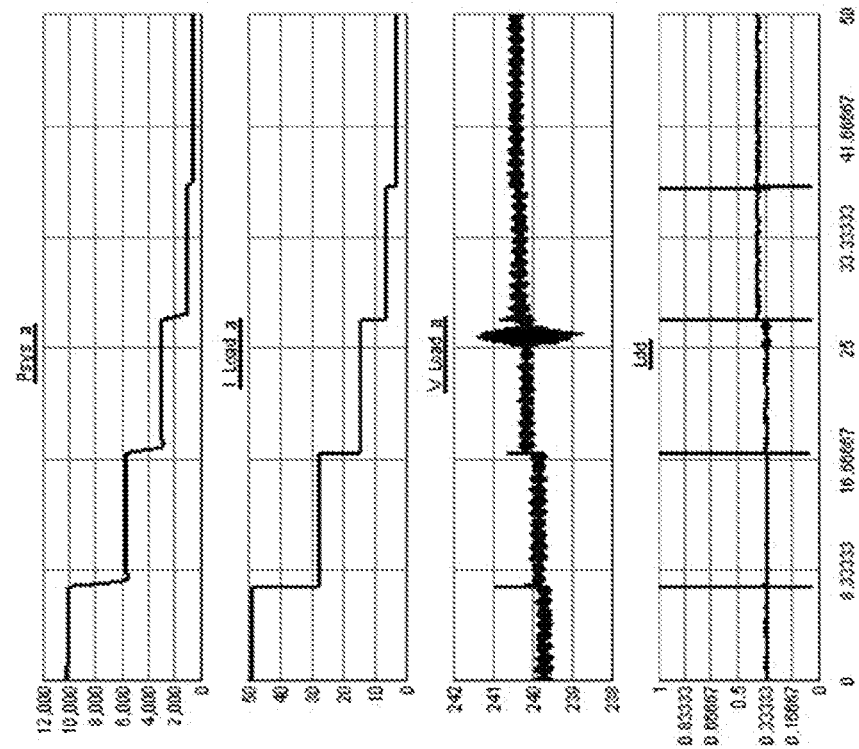
FIG. 19A is a graph of real-time simulation results for the RSCAD test system under load shedding conditions for SST1.

In the second test scenario, connected power to the SSTs were diminished by increment in R and L values of the variable Rl, loads connected to the SSTs. As it was described previously, SST is a constant voltage device at its output terminals. The increment in the R and L values led to decrement in the total power of the test system (it is accurate to interpret this as load shedding condition in this terminal) and were made by step changes in the variables. The values of the R and L for both SSTs are shown in Table 1. Furthermore, the corresponding simulation results, i.e., active power of the SST, RMS load current and voltage and the unit circle stability criterion for both SSTs are shown in FIGS. 19A and 19B.

TABLE 1

R AND L VALUES CONNECTED TO THE SSTs FOR THE POWER DECREMENT SCENARIO

| Time (s) | SST 1 | | SST 2 | |
|---|---|---|---|---|
| | R (Ω) | L (mH) | R (Ω) | L (mH) |
| 0-10 | 4.45 | 5.81 | 3.01 | 3.80 |
| 10-20 | 8 | 10 | 6 | 9.50 |

TABLE 1-continued

R AND L VALUES CONNECTED TO THE SSTs
FOR THE POWER DECREMENT SCENARIO

| | SST 1 | | SST 2 | |
|---|---|---|---|---|
| Time (s) | R (Ω) | L (mH) | R (Ω) | L (mH) |
| 20-30 | 15 | 20 | 12 | 20 |
| 30-40 | 30 | 70 | 28.8 | 60 |
| 40-50 | 60 | 140 | 56 | 120 |

As it was shown in FIGS. 19A and 19B, the unit circle stability criterion ($L_{dd}$) for both SSTs remained less than one, meaning that both SSTs were in the stable region during these operating points. By analyzing the real power of each SST, it was evident that in this test case each SST operated under its nominal operating point and this fact may be also interpreted by the $L_{dd}$ graphs.

The final test scenario studied was the SST's stability under different loading conditions in real-time when the value of the RL loads connected to the SST 1 decline. As a result (and based on regulated output voltage characteristics of SST), drawn power by the SST 1 increased to the point that made the test system unstable. The load decrement at this test scenario was also made by the step changes in the R and L in 10 s time intervals.

Figure 20B:
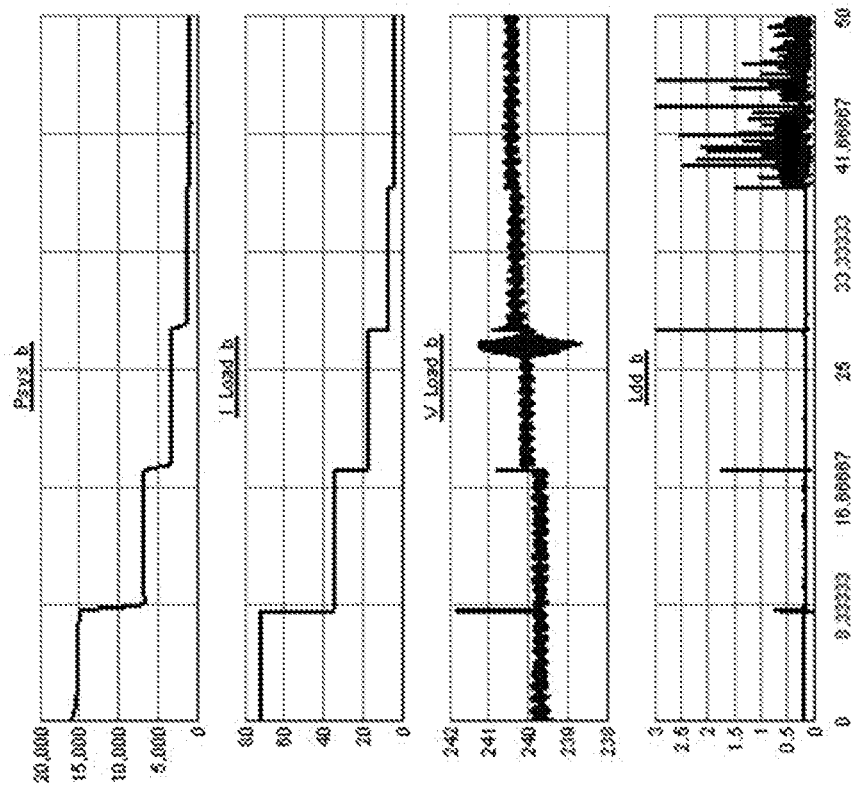
FIG. 20B is a graph of the simulation results for load shedding condition for SST2.
Figure 20A:
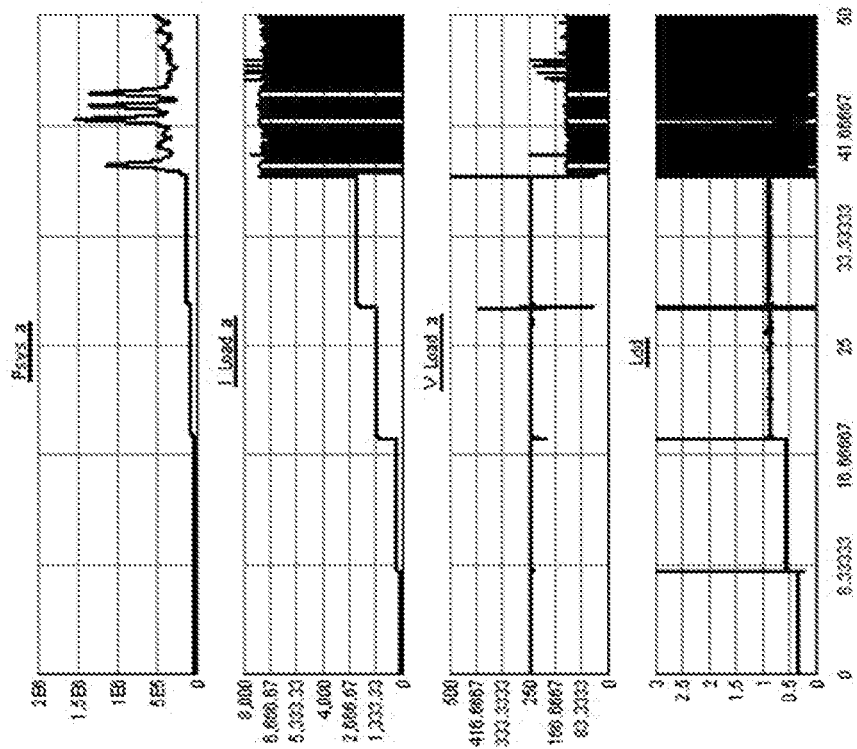
FIG. 20A is a graph of simulation results for the RSCAD test system under load increase condition for SST1.

In this test scenario, in order to be able to study effects of unstable SST on the PEDS and other PECs (i.e., SST 2), load increment for SST 1 occurred individually and while the SST 2 experienced the load shedding condition (fully stable based on previous test case). This helped to distinguish influences of unstable SST on the stable PEDS and PECs. Table 2 illustrates Rs and Ls changes for both SSTs in this scenario (decrement for the SST 1 and increment for the SST 2 values). The unit circle stability criterion for this test case and during the load changes is shown in FIGS. 20A and 20B along with the SSTs' powers and RMS load currents and voltages.

TABLE 2

VALUES FOR R AND L CONNECTED TO THE SSTs WHILE
SST 1 POWER INCREASES AND SST 2 POWER DECREASES

| | SST 1 | | SST 2 | |
|---|---|---|---|---|
| Time (s) | R (Ω) | L (mH) | l (Ω) | L (mH) |
| 0-10 | 4.45 | 5.81 | 3.01 | 3.80 |
| 10-20 | 0.445 | 2.5 | 6 | 9.50 |
| 20-30 | 0.0445 | 0.5 | 12 | 20 |
| 30-40 | 0.0225 | 0.275 | 28.8 | 60 |
| 40-50 | 0.01536 | 0.0271 | 56 | 120 |

As it is evident from FIG. 20A, SST 1 became unstable by increasing the SST's load power. It is illustrated in the active power plot for SST 1 that after it becomes unstable, the active power cannot converge to a specific value. Furthermore, the $L_{dd}$ plot confirms this fact and the load increment in the SST 1 resulted in increments in the unit circle criterion to the point that it reached (and passed) the critical value of 1 and the system became unstable.

An interesting fact in this study was the behavior of the SST 2 under this condition. Based on the second test scenario, it was expected that SST 2 would operate in the stable region, since it experienced the load shedding condition (similar to the second test scenario). From the power, current, and voltage plots this fact is evident. The only difference between FIG. 19B and FIG. 20B is the $L_{dd}$ plot which in FIG. 20B the unit circle criterion exceeds 1, even though the SST 2 was stable, the PEDS was unstable and the developed stability criterion depicted this fact. In fact, various embodiments have the capability to determine the systems' small-signal stability regardless of the stability of the PEC.

Figure 21:
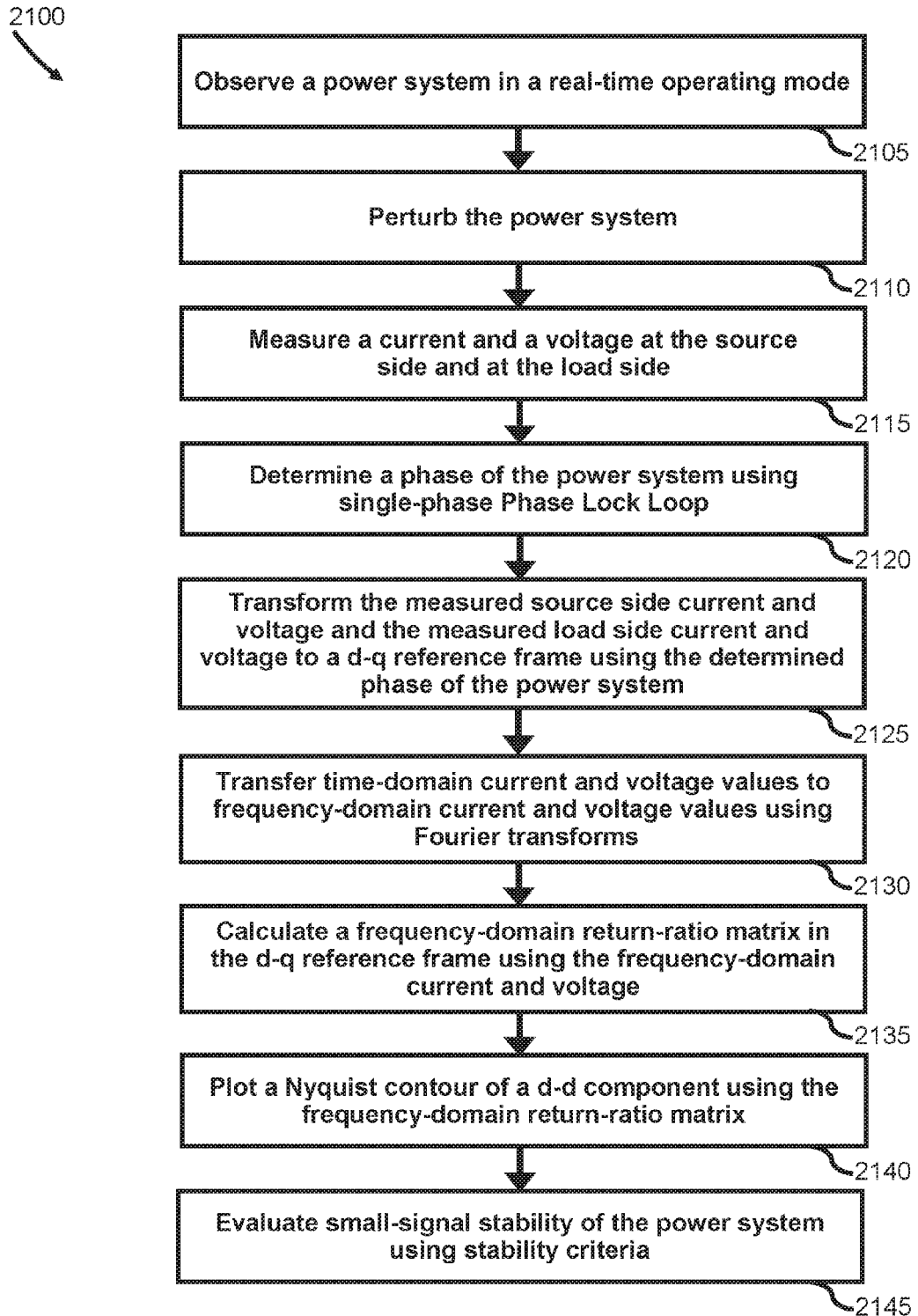
FIG. 21 illustrates a general flow diagram of various embodiments of a method for real-time analysis of small-signal stability of power electronic-based components in a power system.

FIG. 21 illustrates a general flow diagram of various embodiments of a method 2100 for real-time analysis of small-signal stability of power electronic-based components in a power system. At step 2105, a power system may be observed in a real-time operational mode. The power system may comprise a source side and a load side, among other components. The power system may be perturbed at step 2110, and then a current and voltage may be measured at both the source side and the load side at step 2115. A phase of the power system may be determined at step 2120 using single-phase Phase Lock Loop. At step 2125, the measured source side current and voltage and the measured load side current and voltage may be transformed to a d-q reference frame using the determined phase of the power system. Time-domain current and voltage values may be transferred to frequency-domain current and voltage values using fast Fourier transform at step 2130. At step 2135, a frequency-domain return-ratio matrix may be calculated in the d-q reference frame using the frequency-domain current and voltage. A Nyquist contour may be plotted at step 2140 of a d-d component using the frequency-domain return-ratio matrix. A small-signal stability of the power system may be evaluated using stability criteria, such as unit circle criterion or Generalized Nyquist Criterion at step 2145.

Figure 22:
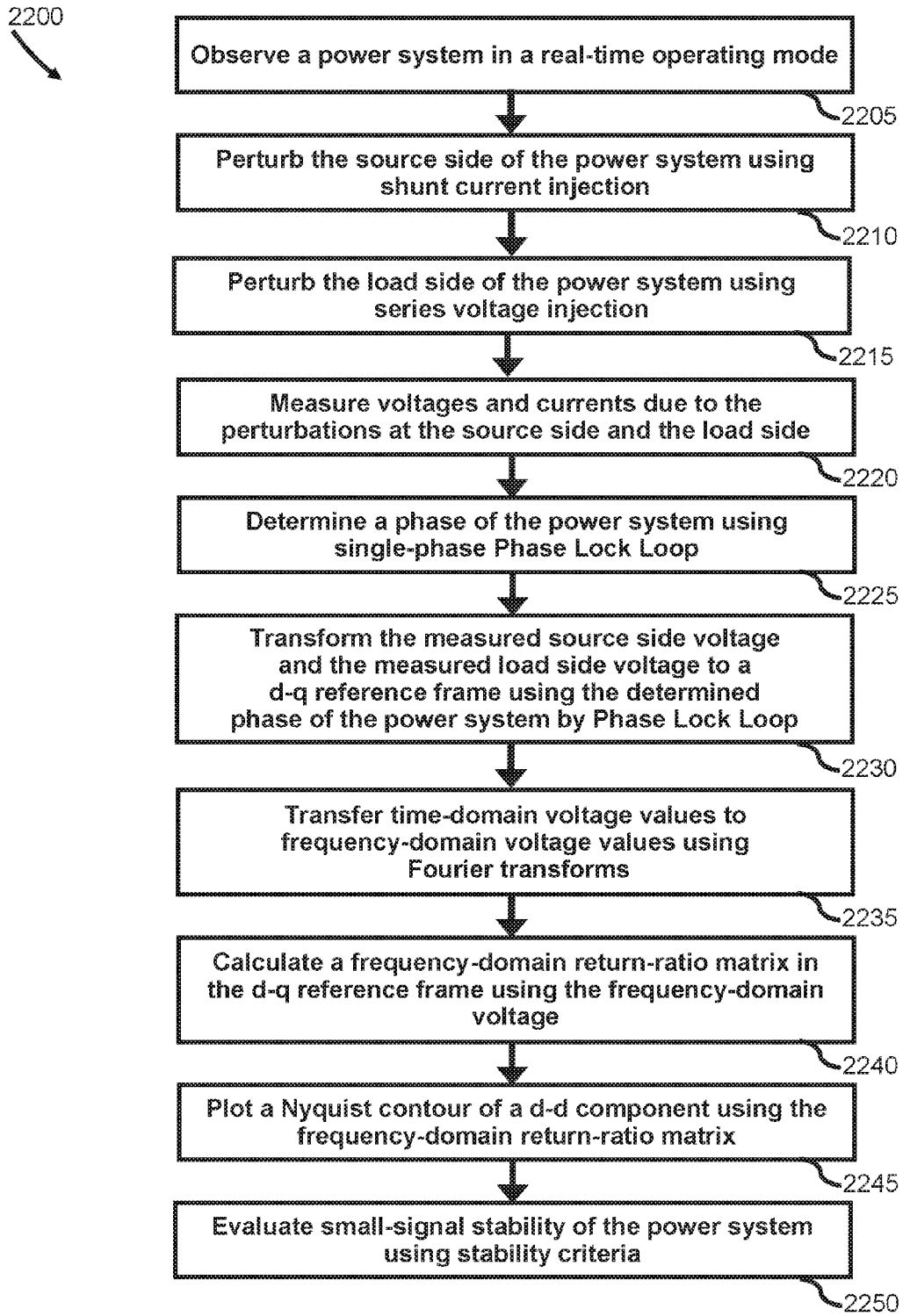
FIG. 22 illustrates a general flow diagram of various embodiments of a method for real-time analysis of small-signal stability of power electronic-based components in a power system.

FIG. 22 illustrates a general flow diagram of various embodiments of another method 2200 for real-time analysis of small-signal stability of power electronic-based components in a power system. At step 2205, a power system may be observed in a real-time operational mode. The power system may comprise a source side and a load side, among other components. The source side of the power system may be perturbed using shunt current injection at step 2210, and then the load side of the power system may be perturbed using series voltage injection at step 2215. Currents and voltages due to the perturbations may be measured at both the source side and the load side at step 2220. A phase of the power system may be determined at step 2225 using single-phase Phase Lock Loop. At step 2230, the measured source side current and voltage and the measured load side current and voltage may be transformed to a d-q reference frame using the determined phase of the power system by Phase-Lock Loop. Time-domain current and voltage values may be transferred to frequency-domain current and voltage values using Fourier transforms at step 2235. At step 2240, a frequency-domain return-ratio matrix may be calculated in the d-q reference frame using the frequency-domain current and voltage. A Nyquist contour may be plotted at step 2245 of a d-d component using the frequency-domain return-ratio matrix. A small-signal stability of the power system may be evaluated using stability criteria such as unit circle criterion or Generalized Nyquist Criterion at step 2250.

Figure 1:
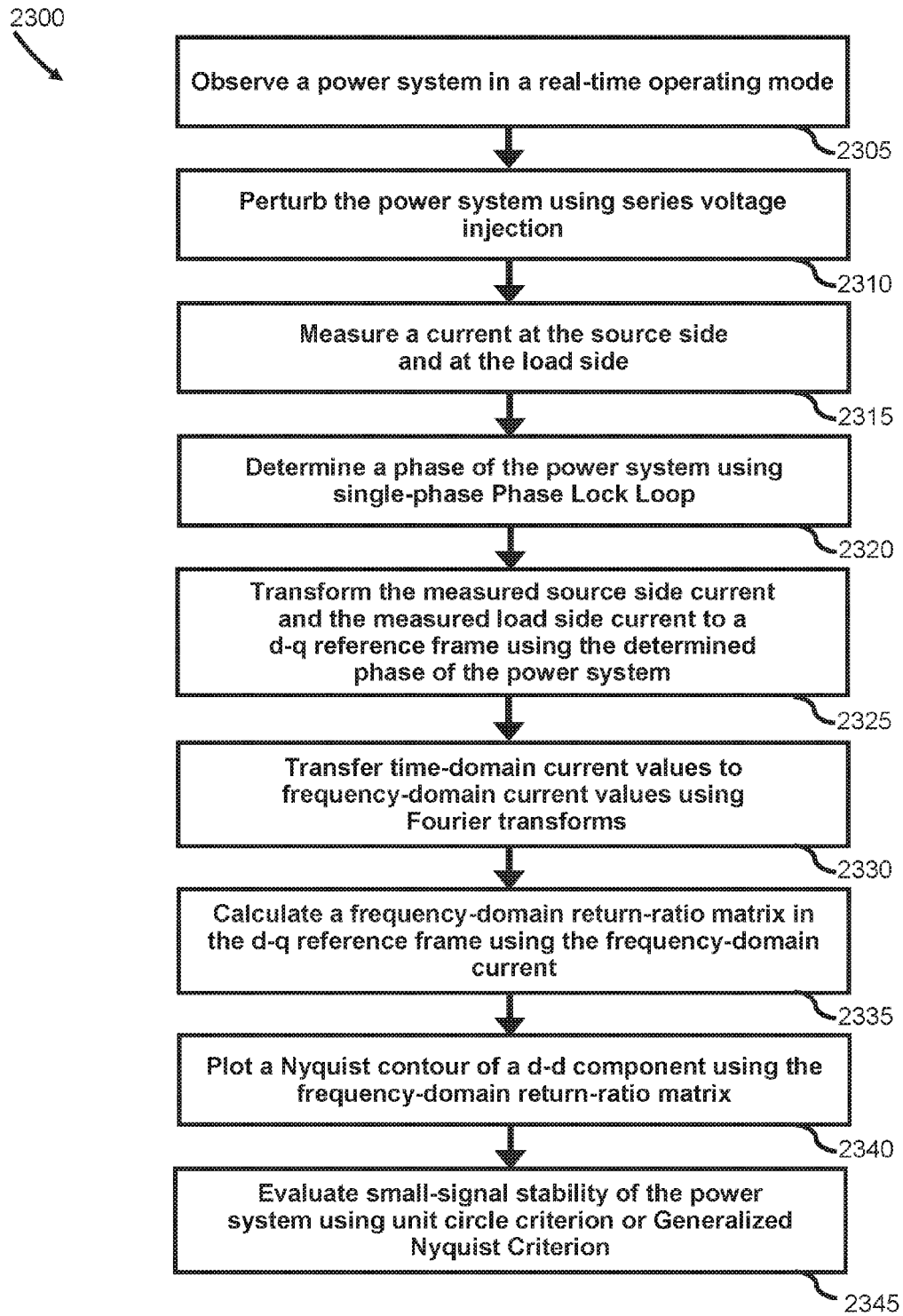
FIG. 1 illustrates a general flow diagram of various embodiments of a method for real-time analysis of small-signal stability of power electronic-based components in a power system.

FIG. 1 illustrates a general flow diagram of various embodiments of yet another method 2300 for real-time analysis of small-signal stability of power electronic-based components in a power system. At step 2305, a power system may be observed in a real-time operational mode. The power system may comprise a source side and a load side, among other components. The power system may be perturbed using series voltage injection at step 2310, and then a current and voltage may be measured at both the source side and the load side at step 2315. A phase of the power system may be determined at step 2320 using single-phase Phase Lock Loop. At step 2325, the measured source side current and voltage and the measured load side current and voltage may be transferred to d-q reference frame using the determined phase of the power system. Time-domain current and voltage values may be transferred to frequency-domain current and voltage values using fast Fourier transform at step 2330. At step 2335, a frequency-domain return-ratio matrix may be calculated in the d-q reference frame using the frequency-domain current and voltage. A Nyquist contour may be plotted at step 2340 of a d-d component using the frequency-domain return-ratio matrix. A small-signal stability of the power system may be evaluated using stability criterion such as unit circle criterion or Generalized Nyquist Criterion at step 2345.

Various embodiments may be stored or implemented on computer readable medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Programs embodied on a computer readable medium may be transmitted using any appropriate medium, including but not limited to wireless, wire-line, optical fiber cable, radio frequency, etc., or any suitable combination of the foregoing. Computer programs for carrying out operations for aspects of the present disclosure may be written in any combination of one or more programming languages, including an object oriented programming language such as Java, C#, C++ or the like and conventional procedural programming languages, such as the "C" programming language or similar programming languages.

Aspects of the present invention may be described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The advantages set forth above, and those made apparent from the foregoing description, are efficiently attained. Since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention that, as a matter of language, might be said to fall there between.

DEFINITION OF CLAIM TERMS d-q reference frame: A graphical representation of a power system that facilitates stability analysis of the power electronic-based components through ac interfaces.

Fast Fourier transform: An algorithm to compute the discrete Fourier transform and its inverse, used for converting between time and frequency.

Frequency-domain: Analysis of the power system with respect to frequency.

Fundamental current: The current at which a power system is designed to operate.

Fundamental frequency: The frequency at which a power system is designed to operate.

Generalized Nyquist Criterion: Nyquist criterion is a graphical technique for determining the stability of a dynamic linear system, and Generalized Nyquist Criterion extends the technique to nonlinear systems.

Instability borders: In a graphical representation of a power system, the maximum values within which the power system remains operationally stable.

Load: A device in an electrical circuit that draws power.

Nyquist contour: in a Nyquist plot, a contour that encompasses the right-half of the complex plane.

Operational mode: A period of time in which a power system is actually functioning, as opposed to the design mode in which the power system is theoretical.

Perturbing or perturbation: Disturbing the fundamental current or fundamental frequency of a power system.

Power electronic-based components: Solid-state electronics used for the control and conversion of electric power.

Power system: A network of electrical components used to supply, transmit and use electric power.

Relative stability: An indication of the stability of a power system based on the return-ratio matrix.

Return-ratio matrix: A mathematical matrix representation of the return current or voltage when the current or voltage of a power source is perturbed.

Series voltage injection: Adding voltage between the load and the source of a power system.

Shunt current injection: Adding current between the load and the source of a power system.

Single-phase Phase Lock Loop: A control system that generates an output signal whose phase is related to the phase of an input signal.

Small signal: An AC signal superimposed on a circuit containing a large signal (the large signal being orders of magnitude larger than the small signal).

Source: A source of current in an electrical circuit.

Stability: The ability of an electrical circuit to handle fluctuations in operational conditions.

Time-domain: Analysis of the power system with respect to time.

REFERENCES

[1] Mohamed Belkhayat, Roger Cooley, and Arthur Witulski, "Large signal stability criteria for distributed systems with constant power loads," in Proc. IEEE Power Electron. Specialists Conf., Jun. 1995, vol. 2, pp. 1333-1338.

[2] Benjamin P. Loop, Scott D. Sudhoff, Stanislaw H. Zak, and Edwin L. Zivi, "Estimating Regions of Asymptotic Stability of Power Electronics Systems Using Genetic Algorithms Benjamin", IEEE Transactions on Control Systems Technology, vol. 18, no. 5, pp. 1011-1022, September 2010.

[3] Sara M. Ahmed, "Computer Modeling and Simulation of Power Electronics Systems for Stability Analysis", MS Thesis, Virginia Polytechnic Institute and State University, Department of EE, 2007.

[4] Hadi Saadat, "Power System Analysis", 3rd Edition, McGraw-Hill, Inc., 2011.

[5] R. David Middlebrook, "Input filter considerations in design and application of switching regulators," in Proc. IEEE Ind. Appl. Soc. Conf., October 1976, pp. 366-382.

[6] Paolo Mattavelli, Dushan Boroyevich, "Small-Signal Stability and Subsystem Interactions in Three-Phase Nano-Grids", Center for Power Electronics Systems Conference, 2012.

[7] Mohamed Belkhayat, "Stability criteria for ac power systems with regulated loads", Ph.D. dissertation, Purdue University, 1997.

[8] Scott D. Sudhoff, Steven F. Glover, Peter T. Lamm, Donald H. Schmucker, and D. E. Delisle, "Admittance space stability analysis of power electronic systems", Aerospace and Electronic Systems, IEEE Transactions on DOI-10.1109/7.869516, vol. 36, no. 3, pp. 965-973, 2000.

[9] Scott D. Sudhoff, Jonathan M. Crider, "Advancements in Generalized Immittance Based Stability Analysis of DC Power Electronics Based Distribution Systems", Electric Ship Technologies Symposium (ESTS), IEEE, 2011.

[10] Scott D. Sudhoff, Benjamin P. Loop, J. Byoun, and Aaron M. Cramer, "A New Procedure for Calculating Immittance Characteristics Using Detailed Computer Simulations", presented in IEEE PESC 2007, pp. 901-908.

[11] Scott D. Sudhoff, Steven F. Glover, "Modeling Techniques, Stability Analysis, and Design Criteria for DC Power Systems with Experimental Validation," 1998 SAE Transactions, Journal of Aerospace, Section 1, pp. 52-67.

[12] Rolando Burgos, Dushan Boroyevich, Fred Wang, Kamiar Karimi, and Gerald Francis, "Ac stability of high power factor multi-pulse rectifiers", in Energy Conversion Congress and Exposition (ECCE), 2011 IEEE, pp. 3758-3765, 2011.

[13] Yakov A. Familiant, Jing Huang, Keith A. Corzine, Mohamed Belkhayat, "New Techniques for Measuring Impedance Characteristics of Three-Phase AC Power Systems", IEEE Transactions on Power Electronics, vol. 24, no. 7, July 2009.

[14] Jing Huang, Keith A. Corzine, Mohamed Belkhayat, "Small-Signal Impedance Measurement of Power-Electronics-Based AC Power Systems Using Line-to-Line Current Injection", IEEE Transactions on Power Electronics, vol. 24, no. 2, pp. 445-455, 2009.

[15] Tiefu Zhao, Jie Zeng, Subhashish Bhattacharya, Mesut E. Baran, Alex Q. Huang, "An Average Model of Solid State Transformer for Dynamic System Simulation", IEEE Conference of Power & Energy Society General Meeting, PES '09, 2009.

[16] Johannes Gerlof Slootweg, "Wind Power Modelling and Impact on Power System Dynamics", Ph.D. dissertation, TU Delft, Netherland, December 2003.

[17] S. D. Sudhoff, S. F. Glover, "Three Dimensional Stability Analysis of DC Power Electronics Based Systems", Proceedings of the Power Electronics Specialist Conference, Galway, Ireland, Jun. 19-22, 2000, pp. 101-106.

[18] N. Bottrell, M. Prodanovic, and T. C. Green, "Analyzed Small Signal State-Space Model of an Active Rectifier", UPEC 2010, August 31.

[19] Nagaraju Pogaku, Milan Prodanovic', and Timothy C. Green, "Modeling, Analysis and Testing of Autonomous Operation of an Inverter-Based Microgrid", IEEE Transactions on Power Electronics, Vol. 22, No. 2, March 2007, pp. 613-625.

[20] Koson Chaijaroenudomrung, Kongpan Areerak, and Kongpol Areerak, "The Stability Study of ac-dc Power System with Controlled Rectifier Including Effect of Voltage Control", European Journal of Scientific Research, Vol. 62, No. 4, pp. 463-480, 2011.

[21] G. O. Kalcon, G. P. Adam, O. Anaya-Lara, S. Lo, and K. Uhlen; "Small-Signal Stability Analysis of Multi-Terminal VSC-Based DC Transmission Systems", IEEE Transactions on Power Systems, vol. 27, no. 4, pp. 1818-1830, 2012.

[22] Y. Berkovich and A. Ioinovici, "Large-signal stability-oriented design of boost regulators based on a Lyapunov criterion with nonlinear integral", IEEE Trans. Circuits Syst. I, Reg. Papers, vol. 49, no. 11, pp. 1610-1619, November 2002.

[23] S. R. Sanders and G. C. Verghese, "Lyapunov-based control for switched power converters", IEEE Transactions on Power Electronics, vol. 7, no. 1, pp. 17-24, January 1992.

[24] Sun Jian; "Impedance-Based Stability Criterion for Grid-Connected Inverters", Power Electronics, IEEE Transactions on Power Electronics, vol. 26, no. 11, pp. 3075-3078, 2011.

[25] Y. L. Familiant, K. A. Corzine, J. Huang, and M. Belkhayat, "AC Impedance Measurement Techniques", in Electric Machines and Drives, 2005 IEEE International Conference on, 2005, pp. 1850-1857.

[26] M. Amin Salmani, Chris S. Edrington, "Small-Signal Stability Assessment of the Power Electronic-Based AC Systems Using Impedance Measurement-Based Technique", NAPS' 13, September 2013.

[27] Zhiyu Shen, Marko Jaksic, Paolo Mattavelli, Dushan Boroyevich, Jacob Verhulst, Mohamed Belkhayat, Three-phase AC System Impedance Measurement Unit (IMU) using Chirp Signal Injection, APEC (2013).

[28] Zhiyu Shen, Marko Jaksic, Paolo Mattavelli, Dushan Boroyevich, Jacob Verhulst, Mohamed Belkhayat, Design and Implementation of Three-phase AC Impedance Measurement Unit (IMU) with Series and Shunt Injection, APEC (2013).

[29] R. C. Dugan, W. H. Kersting, Fellow, "Induction machine test case for the 34-Bus test feeder—description", in: Power Engineering Society General Meeting, 2006.

[30] T. Zhao, J. Zeng, S. Bhattacharya, M. E. Baran, A. Q. Huang, An average model of solid state transformer for dynamic system simulation, in: IEEE Conference of Power and Energy Society General Meeting, Power & Energy Society Genera lMeeting, 2009.

What is claimed is:

1. A method for real-time analysis of small-signal stability of
a power system, the method comprising:
providing non-transitory computer readable media having computer-executable instructions for performing a method of running a software program on a computing device, the computing device operating under an operating system, the method including issuing instructions from the software program comprising;
observing the power system in a real-time operational mode, the power system comprising a source side and a load side from a perspective of the power electronic-base component;
perturbing the source side of the power electronic-based component by injecting a current of about 0.5 to about 1 percent of a nominal current of the power system at the source side using shunt current injection and perturbing the load side of the power electronic-based component by varying a voltage of the power system using series voltage injection, wherein perturbing the source side of the power electronic-based component using shunt current injection and perturbing the load side of the power electronic-based component using series voltage injection occurs simultaneously;
measuring currents and voltages at the source side and at the load side;
determining a phase of the power system using single-phase Phase Lock Loop;
transforming the measured source side current and voltage and the measured load side current and voltage to a d-q reference frame using the determined phase of the power system;
transferring time-domain source side current and voltage values and time-domain load side current and voltage values to frequency-domain current and voltage values using Fourier transforms;
calculating a frequency-domain return-ratio matrix in the d-q reference frame using the frequency-domain source side current and voltage values and the frequency-domain load side current and voltage values;
plotting a Nyquist contour of a d-d component of the frequency-domain return-ratio matrix; and
defining a relative stability of the power system and comparing the relative stability to instability borders of the power system to evaluate the small-signal stability of the power system using stability criteria.

2. The method of claim 1, wherein a frequency of the perturbations range from about 0.1 Hz to about 1000 Hz.

3. The method of claim 1, wherein perturbing the source side of the power electronic-based component comprises varying a current of the power system.

4. The method of claim 1, wherein perturbing the source side of the power electronic-based component and perturbing the load side of the power electronic-based component comprises one or more independent perturbations.

5. The method of claim 4, wherein the one or more independent perturbations occur over a range of frequencies other than a fundamental frequency of the power system.

6. The method of claim 4, wherein the one or more independent perturbations are based on responses of the power system to one or more previous perturbations.

7. The method of claim 1, wherein using Fourier transforms further comprises defining a phase and magnitude of the current of the load side and the source side of the power system.

8. The method of claim 7, wherein the one or more independent perturbations are based on responses of the power system to one or more previous perturbations.

9. The method of claim 1, wherein evaluating the small-signal stability of the power system further comprises utilizing Nyquist immittance criterion.

10. The method of claim 1, wherein perturbing the load side of the power electronic-based component comprises injecting a voltage of about 0.5 to about 1 percent of a nominal voltage of the power system.

* * * * *